(12) United States Patent
Stoessel et al.

(10) Patent No.: US 9,634,268 B2
(45) Date of Patent: Apr. 25, 2017

(54) ELECTRONIC DEVICE COMPRISING METAL COMPLEXES

(75) Inventors: Philipp Stoessel, Frankfurt am Main (DE); Dominik Joosten, Frankfurt am Main (DE); Esther Breuning, Ober-Ramstadt (DE)

(73) Assignee: Merck Patent GmbH, Darmstadt (DE)

( * ) Notice: Subject to any disclaimer, the term of this patent is extended or adjusted under 35 U.S.C. 154(b) by 1156 days.

(21) Appl. No.: 13/513,592

(22) PCT Filed: Nov. 9, 2010

(86) PCT No.: PCT/EP2010/006821
§ 371 (c)(1),
(2), (4) Date: Jun. 4, 2012

(87) PCT Pub. No.: WO2011/066898
PCT Pub. Date: Jun. 9, 2011

(65) Prior Publication Data
US 2012/0286254 A1  Nov. 15, 2012

(30) Foreign Application Priority Data
Dec. 5, 2009 (DE) .................. 10 2009 057 167

(51) Int. Cl.
| H01L 51/54 | (2006.01) |
| C09K 11/06 | (2006.01) |
| H01L 51/00 | (2006.01) |
| C09B 57/10 | (2006.01) |
| H01L 51/50 | (2006.01) |

(52) U.S. Cl.
CPC .......... *H01L 51/0091* (2013.01); *C09B 57/10* (2013.01); *C09K 11/06* (2013.01); *H01L 51/0083* (2013.01); *H01L 51/0084* (2013.01); *H01L 51/0087* (2013.01); *H01L 51/0092* (2013.01); *C09K 2211/1029* (2013.01); *C09K 2211/1033* (2013.01); *C09K 2211/1037* (2013.01); *C09K 2211/1044* (2013.01); *C09K 2211/185* (2013.01); *C09K 2211/187* (2013.01); *C09K 2211/188* (2013.01); *H01L 51/002* (2013.01); *H01L 51/5012* (2013.01); *H01L 51/5016* (2013.01); *Y02E 10/549* (2013.01)

(58) Field of Classification Search
CPC ...... C07F 1/00; C07F 1/08; C07F 3/06; C07F 7/2224; C07F 7/2284; C07F 7/24; C07F 15/04; C07F 15/006; C07F 15/0086; H01L 51/0083; H01L 51/0087; H01L 51/0091; H01L 51/0092; H01L 51/50; H01L 51/5012; H01L 51/5016; C09K 11/06; C09K 2211/1029; C09K 2211/1033; C09K 2211/1044; C09K 2211/1048; C09K 2211/1059; C09K 2211/185; C09K 2211/187; C09K 2211/188
See application file for complete search history.

(56) References Cited

U.S. PATENT DOCUMENTS

| 2006/0073360 A1 | 4/2006 | Ise et al. |
| 2006/0263633 A1* | 11/2006 | Ichijima et al. ............... 428/690 |
| 2008/0199731 A1 | 8/2008 | Vogler et al. |
| 2010/0227978 A1 | 9/2010 | Stoessel et al. |
| 2011/0012100 A1 | 1/2011 | Stoessel |

FOREIGN PATENT DOCUMENTS

| DE | 102008015526 A1 | 10/2009 |
| JP | 2008-514562 A | 5/2008 |
| WO | WO-03/022008 A1 | 3/2003 |
| WO | WO-2004/081017 A1 | 9/2004 |

OTHER PUBLICATIONS

Kimani et al. "Probing the antioxidant action of selenium and sulfur using Cu(I)-chalcogenone tris(pyrazolyl)methane and—borate complexes." Inorg. Chem. vol. 49, pp. 9200-9211. 2010.*
Grant & Hackh's Chemical Dictionary, Fifth Edition, McGraw-Hill, Inc., 1987, p. 290.*
International Search Report for PCT/EP2010/006821 mailed Feb. 15, 2011.

* cited by examiner

*Primary Examiner* — Marie R. Yamnitzky
(74) *Attorney, Agent, or Firm* — Drinker Biddle & Reath LLP

(57) ABSTRACT

Electronic devices, in particular organic electroluminescent devices, comprising metal complexes of the formula (1).

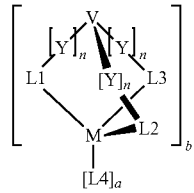

formula (1)

15 Claims, No Drawings

ELECTRONIC DEVICE COMPRISING METAL COMPLEXES

CROSS-REFERENCE TO RELATED APPLICATIONS

This application is a national stage application (under 35 U.S.C. §371) of PCT/EP2010/006821, filed Nov. 9, 2010, which claims benefit of German Application 10 2009 057 167.1, filed Dec. 5, 2009.

The present invention relates to electronic devices, in particular organic electroluminescent devices, comprising metal complexes, and to the metal complexes which are preferred for the use.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. The emitting materials employed here are increasingly organometallic complexes, which exhibit phosphorescence instead of fluorescence (M. A. Baldo et al., *Appl. Phys. Lett.* 1999, 75, 4-6). For quantum-mechanical reasons, an up to four-fold increase in energy and power efficiency is possible using organometallic compounds as phosphorescence emitters. In general, there is still a need for improvement in OLEDs which exhibit triplet emission. Thus, the physical properties of phosphorescent OLEDs with respect to efficiency, operating voltage and lifetime are still inadequate for use of triplet emitters in high-quality and long-lived electroluminescent devices. This applies, in particular, to OLEDs which emit in the relatively short-wavelength range, i.e. green and in particular blue. Thus, no blue-emitting triplet emitters which meet the technical requirements for industrial application are known to date.

In accordance with the prior art, the triplet emitters employed in phosphorescent OLEDs are, in particular, iridium and platinum complexes. However, these have the disadvantage that the metals involved have very low abundance and are therefore also correspondingly expensive. In order to protect the natural resources of these metals, it would therefore be desirable to have available emitters based on other metals. A further disadvantage of the iridium and platinum complexes usually used consists in that they are usually organometallic complexes having metal-carbon bonds. Metal-carbon bonds of this type are in some cases only accessible with difficulty synthetically. Furthermore, these complexes in some cases have only low thermal stability.

The object of the present invention is therefore the provision of metal complexes which are suitable as emitters or also as matrix materials or in other functions for use in OLEDs, where they result in high efficiencies and long lifetimes, and which are readily accessible synthetically.

Surprisingly, it has been that certain metal chelate complexes which are described in greater detail below achieve this object and are very highly suitable for use in organic electroluminescent devices, in particular on use as emitting material. They exhibit a long lifetime, high efficiency and good stability to heating. Furthermore, the central atom of these complexes is not iridium as rare metal. A further advantage of these complexes is that they are readily accessible synthetically. The present invention therefore relates to organic electroluminescent devices which comprise these complexes, and to the preferred metal complexes.

The present invention thus relates to an electronic device comprising an anode, a cathode and at least one compound of the formula (1)

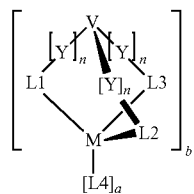

formula (1)

containing a metal M coordinated to a ligand L of the formula (2)

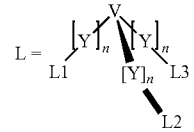

formula (2)

where the following applies to the symbols and indices used:

M is selected from Cu, Ag, Au, Zn, Sn, Pb, Ni, Pd or Pt;

V is selected from the group consisting of B, BR$^-$, CR, CO$^-$, SiR, N, NR$^+$, P, PR$^+$, P(=O), As, AsR$^+$, As(=O), Sb, SbR$^+$, Sb(=O) and S$^+$; or V is an aliphatic, aromatic or heteroaromatic cyclic group having 3 to 6 ring atoms, which covalently bond the part-ligands L1, L2 and L3 to one another, optionally via the group Y, and which may be substituted by one or more radicals R;

Y is on each occurrence, identically or differently, a divalent group selected from CR$_2$, BR, SiR$_2$, NR, PR, P(=O)R, AsR, As(=O)R, SbR, Sb(=O)R, O, S, 1,2-vinylene or 1,2- or 1,3-phenylene, each of which may be substituted by one or more radicals R;

a is 0 or 1;

b is 1, 2 or 3, where the index a=1 for b=2 or 3;

L1 is a heterocyclic group having 1 to 20 C atoms and at least one N atom, which may be substituted by one or more radicals R and which is bonded to M via a neutral or anionic nitrogen atom or via a neutral carbon atom, each of which is part of the heterocyclic group; or is a cyclic or heterocyclic group having 1 to 20 C atoms which is bonded to M via an exocyclic donor atom and which may be substituted by one or more radicals R;

L2, L3 are, identically or differently on each occurrence, a coordinating group, which may be substituted by one or more radicals R and which is bonded to M via nitrogen, phosphorus, sulfur or a neutral carbon atom, where L2 and/or L3 may also be, identically or differently, L1;

L4 is any desired ligand which coordinates to the metal M and which may be substituted by one or more radicals R; L4 here may also be linked to one or more of the part-ligands L1, L2 and/or L3 by a direct bond or by a divalent group —(Y)$_n$—;

n is on each occurrence, identically or differently, 0, 1, 2 or 3;

R is on each occurrence, identically or differently, H, D, F, Cl, Br, I, N(R$^1$)$_2$, CN, NO$_2$, OH, Si(R$^1$)$_3$, B(OR$^1$)$_2$, C(=O)R$^1$, P(=O)(R$^1$)$_2$, S(=O)R$^1$, S(=O)$_2$R$^1$, OSO$_2$R$^1$, a straight-chain alkyl, alkoxy or thioalkoxy group having 1 to 40 C atoms or a branched or cyclic alkyl, alkoxy or thioalkoxy group having 3 to 40 C atoms or an alkenyl or alkynyl group having 2 to 40 C atoms, each of which may be substituted by one or more radicals R$^1$, where one or more non-adjacent CH$_2$ groups may be replaced by $R^1C=CR^1$, $C≡C$, $Si(R^1)_2$, $Ge(R^1)_2$, $Sn(R^1)_2$, $C=O$, $C=S$, $C=Se$, $C=NR^1$, $P(=O)(R^1)$, $SO$, $SO_2$, $NR^1$, $O$, $S$ or $CONR^1$ and where one or more H atoms may be replaced by F, Cl, Br, I, CN or $NO_2$, or an aromatic or heteroaromatic ring system having 5 to 60 aromatic ring atoms, which may in each case be substituted by one or more radicals $R^1$, or an aryloxy, heteroaryloxy, aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$; two or more substituents R here may also form a mono- or polycyclic, aliphatic, aromatic, heteroaromatic and/or benzo-fused ring system with one another;

$R^1$ is on each occurrence, identically or differently, H, D, F, Cl, Br, I, $N(R^2)_2$, CN, $NO_2$, OH, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms or an alkenyl or alkynyl group having 2 to 40 C atoms, each of which may be substituted by one or more radicals $R^2$, where one or more non-adjacent $CH_2$ groups may be replaced by $R^2C=CR^2$, $C≡C$, $Si(R^2)_2$, $Ge(R^2)_2$, $Sn(R^2)_2$, $C=O$, $C=S$, $C=Se$, $C=NR^2$, $P(=O)(R^2)$, $SO$, $SO_2$, $NR^2$, $O$, $S$ or $CONR^2$ and where one or more H atoms may be replaced by F, Cl, Br, I, CN or $NO_2$, or an aromatic or heteroaromatic ring system having 5 to 60 aromatic ring atoms, which may in each case be substituted by one or more radicals $R^2$, or an aryloxy, heteroaryloxy, aralkyl or heteroaralkyl group having 5 to 60 aromatic ring atoms, which may be substituted by one or more radicals $R^2$, or a diarylamino group, diheteroarylamino group or arylheteroarylamino group having 10 to 40 aromatic ring atoms, which may be substituted by one or more radicals $R^2$; two or more substituents $R^1$ here may also form a mono- or polycyclic, aliphatic, aromatic, heteroaromatic and/or benzo-fused ring system with one another;

$R^2$ is on each occurrence, identically or differently, H, D, F or an aliphatic, aromatic and/or heteroaromatic hydrocarbon radical having 1 to 20 C atoms, in which, in addition, one or more H atoms may be replaced by F; two or more substituents $R^2$ here may also form a mono- or polycyclic aliphatic, aromatic, heteroaromatic and/or benzo-fused ring system with one another.

A part-ligand in the sense of the present invention in the ligand of the formula (2) is taken to means groups L1, L2 and L3, i.e. in each case the individual arms of the polypodal ligand, each of which is coordinated to the metal M and linked via the bridgehead V and optionally via Y.

In the structure of the formula (1), an index b=2 or 3 means that in each case 2 or 3 of the metal-complex units are linked via a ligand L4. The ligand L4 is then correspondingly bonded simultaneously to 2 or 3 metals M.

A donor atom in the sense of the present invention is taken to mean an atom which has at least one free electron pair and is consequently capable of bonding to a metal atom or metal ion. The donor atom here may be neutral or negatively charged.

An exocyclic donor atom in the sense of this invention is taken to mean a donor atom which is not part of the cyclic or heterocyclic group L1, but instead is bonded to L1 as a substituent and which has at least one free electron pair and is consequently capable of bonding to a metal atom. Examples of exocyclic donor atoms are oxygen in the form of a phenolate, sulfur in the form of a thiolate, nitrogen in the form of an amine, imine, amide or imide, and phosphorus in the form of a phosphine.

An aryl group in the sense of this invention contains 6 to 60 C atoms; for the purposes of this invention, a heteroaryl group contains 2 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc. A cyclic carbene in the sense of this invention is a cyclic group which is bonded to the metal via a neutral C atom. The cyclic group here may be saturated or unsaturated. Preference is given here to Arduengo carbenes, i.e. carbenes in which two nitrogen atoms are bonded to the carbene C atom.

An aromatic ring system in the sense of this invention contains 6 to 60 C atoms in the ring system. A heteroaromatic ring system in the sense of this invention contains 2 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, an $sp^3$-hybridised C, N or O atom. Thus, for example, systems such as 9,9'-spirobifluorene, 9,9-diarylfluorene, triarylamine, diary ether, stilbene, etc., are also intended to be taken to mean aromatic ring systems in the sense of this invention, and likewise systems in which two or more aryl groups are interrupted, for example, by a linear or cyclic alkyl group or by a silyl group.

For the purposes of the present invention, a $C_1$- to $C_{40}$-alkyl group, in which, in addition, individual H atoms or $CH_2$ groups may be substituted by the above-mentioned groups, is preferably taken to mean the radicals methyl, ethyl, n-propyl, i-propyl, n-butyl, i-butyl, s-butyl, t-butyl, 2-methyl-butyl, n-pentyl, s-pentyl, neopentyl, cyclopentyl, n-hexyl, neohexyl, cyclohexyl, n-heptyl, cycloheptyl, n-octyl, cyclooctyl, 2-ethylhexyl, trifluoromethyl, pentafluoroethyl and 2,2,2-trifluoroethyl. An alkenyl group is preferably taken to mean the radicals ethenyl, propenyl, butenyl, pentenyl, cyclopentenyl, hexenyl, cyclohexenyl, heptenyl, cycloheptenyl, octenyl and cyclooctenyl. An alkynyl group is preferably taken to mean ethynyl, propynyl, butynyl, pentynyl, hexynyl, heptynyl and octynyl. A $C_1$- to $C_{40}$-alkoxy group is preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the radicals R mentioned above and which may be linked to the aromatic or heteroaromatic group via any desired positions, is taken to mean, in particular, groups derived from benzene, naphthalene, anthracene, phenanthrene, benzanthracene, benzophenanthrene, pyrene, chrysene, perilene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The metal complexes of the formula (1) can be complexes of polypodal ligands or cryptates, irrespective of whether the ligand L4 is linked to the part-ligands L1, L2 and L3 or not. A polypodal ligand in the sense of this invention is taken to mean a ligand in which three coordinating part-ligands L1, L2 and L3 are bonded to one another by a group V. The ligands L are therefore polypodal ligands if no further ligand L4 is bonded or if the ligand L4 is only linked to one of the part-ligands L1, L2 or L3. A cryptate in the sense of this invention is taken to mean a compound between a cryptand and a metal ion in which the metal ion is three-dimensionally surrounded by the bridges of the complex-forming cryptand. A cryptand in the sense of this invention is taken to mean a macrocyclic tripodal ligand. A cryptand can arise here if the ligand L4 is linked to two or all three of the part-ligands L1, L2 and/or L3.

In addition, the group V in metal complexes of the formula (1) may also be coordinated to M if the group V has a free electron pair, i.e. if it represents, for example, N or P.

In a preferred embodiment of the invention, a=0 and the group V is coordinated to M. In a further preferred embodiment of the invention, a=1, i.e. one ligand L4 is present, and V is not coordinated to M. As defined above, the part-ligand L1 is a heterocyclic group having at least one N atom which is bonded to M via a neutral or anionic nitrogen atom or via a neutral carbon atom, each of which is part of the heterocyclic group, or it is a cyclic or heterocyclic group having an exocyclic donor atom which is bonded to M. The bonding via a neutral carbon atom is possible in the form of a carbene. The cyclic or heterocyclic group here has at least 5 and a maximum of 20 ring atoms. It may also be a condensed group, i.e. a group in which a plurality of rings are linked to one another via a common edge. The group L1 may be saturated, unsaturated or aromatic or heteroaromatic. In a preferred embodiment of the invention, L1 is a heteroaryl group or an aryl or heteroaryl group having a exocyclic donor atom or a cyclic, saturated or unsaturated carbene. In a particularly preferred embodiment of the invention, the aryl or heteroaryl group has 5 to 14 aromatic ring atoms, very particularly preferably 5 to 10 aromatic ring atoms.

In a preferred embodiment of the invention, the index b=1.

Preference is given to compounds of the formula (1), characterised in that they are uncharged, i.e. are electrically neutral. This is achieved by selecting the charge of the part-ligands L1, L2 and L3 and of the ligand L4 and of the bridging unit V in such a way that they compensate for the charge of the complexed metal ion M.

Preference is furthermore given to compounds of the formula (1), characterised in that the sum of the valence electrons, i.e. the electrons in the outermost shell around the metal atom if it is a transition metal, is 18. This preference is due to the particular stability of these metal complexes.

The metals M are the metals described above, where Cu is preferably in the form of Cu(I), Ag is preferably in the form of Ag(I), Au is preferably in the form of Au(I), Zn is preferably in the form of Zn(II), Sn is preferably in the form of Sn(IV), Pb is preferably in the form of Pb(IV), Ni is preferably in the form of Ni(0), Pd is preferably in the form of Pd(0) and Pt is preferably in the form of Pt(0). The value in brackets after the metal in each case denotes the oxidation state of the metal. The metals M are preferably selected from the group consisting of Cu(I), Ag(I), Ni(0), Pd(0) and Pt(0), particularly preferably Cu(I) and Ag(I), very particularly preferably Cu(I).

In a preferred embodiment of the invention, L1 is selected from the groups of the formulae (3) to (30):

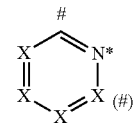

formula (3)

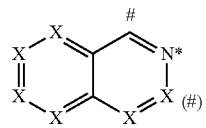

formula (4)

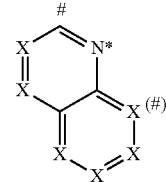

formula (5)

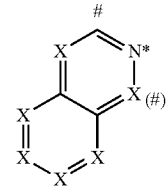

formula (6)

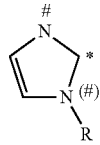

formula (7)

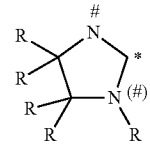

formula (8)

-continued
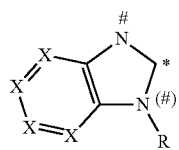
formula (9)
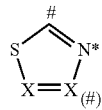
formula (10)
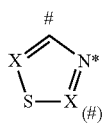
formula (11)
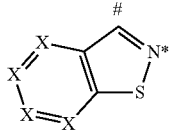
formula (12)
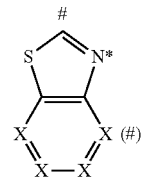
formula (13)
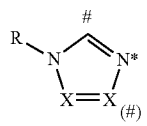
formula (14)
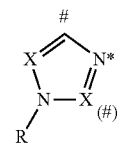
formula (15)
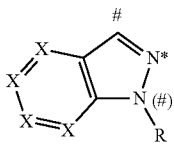
formula (16)
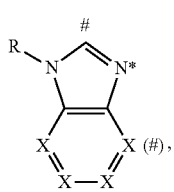
formula (17)
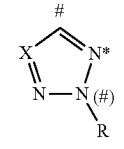
formula (18)
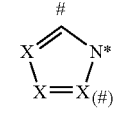
formula (19)
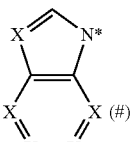
formula (20)
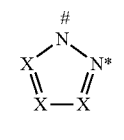
formula (21)
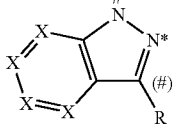
formula (22)
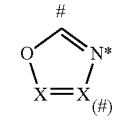
formula (23)
formula (24)
formula (25)
formula (26)
formula (27)
formula (28)

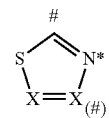

formula (29)

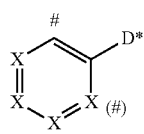

formula (30)

where the symbols used have the same meanings as described above, and furthermore:

X stands on each occurrence, identically or differently, for CR or N;

D stands on each occurrence, identically or differently, for $O^-$, $S^-$, $NR^-$, $PR^-$, $NR_2$, $PR_2$, $COO^-$, $SO_3^-$, —C(=O)R, —CR(=NR) or —N(=CR$_2$).

The groups of the formulae (3) to (30) are coordinated to the metal M via the position denoted by *. The position denoted by # indicates the position at which the part-ligand is bonded to Y or to V. The position denoted by (#) indicates the position at which the part-ligand is optionally bonded to Y or to L4. If a further bond of this type to Y or to L4 is present, the corresponding symbol X stands for C and no group R in the formulae (7), (8), (9), (21) and (23) is bonded to the nitrogen.

Preferably a maximum of three symbols X in each group stand for N, particularly preferably a maximum of two symbols X in each group stand for N, very particularly preferably a maximum of one symbol X in each group stands for N. Especially preferably, all symbols X stand for C.

L2 and L3 are groups which coordinate in accordance with the definition and which may also be substituted by one or more radicals R and which are bonded to M via nitrogen, phosphorus, sulfur, oxygen or a neutral carbon atom, where L2 and L3 may also be, identically or differently, L1. In a preferred embodiment of the invention, L2 and L3 are, identically or differently on each occurrence, a coordinating group which is bonded to M via nitrogen, phosphorus or sulfur, or are, identically or differently, L1.

Preferred coordinating groups which are bonded to M via nitrogen are selected from the group consisting of —NR$_2$, —NR$^-$, —CR$^1$=NR$^1$ and —N=C(R$^1$)$_2$, where R and R$^1$ have the meanings indicated above. R and R$^1$ are particularly preferably, identically or differently on each occurrence, an alkyl group having 1 to 10 C atoms, which may be substituted by one or more radicals R$^1$ or R$^2$, depending on whether the alkyl group is bonded to the radical R or R$^1$.

Preferred coordinating groups which are bonded to M via phosphorus are selected from the group consisting of —PR$_2$, —PR(OR) and P(OR)$_2$, where R has the meanings indicated above. R is particularly preferably, identically or differently on each occurrence, an aromatic or heteroaromatic ring system, which may be substituted by one or more radicals R$^1$.

Preferred coordinating groups which are bonded to M via sulfur are selected from the group consisting of —S$^-$ or —SR, where R has the meanings indicated above. R is particularly preferably, identically or differently on each occurrence, an alkyl group having 1 to 10 C atoms, which may be substituted by one or more radicals R$^1$, or an aromatic or heteroaromatic ring system, which may be substituted by one or more radicals R$^1$.

Particular preference is given to compounds of the formula (1), characterised in that L2 is, identically or differently on each occurrence, L1. Very particular preference is given to compounds of the formula (1), characterised in that L2 and L3 are, identically or differently on each occurrence, L1.

In a further preferred embodiment of the invention, Y is, identically or differently on each occurrence, a divalent group selected from CR$_2$, BR, SiR$_2$, NR, PR, P(=O)R, O or S, particularly preferably CR$_2$, SiR$_2$, NR, O or S, very particularly preferably CR$_2$.

In a further preferred embodiment of the invention, the index n is, identically or differently on each occurrence, 0, 1 or 2. The index n is preferably =0 or 1, in particular 0, if the group V is not coordinated to M. Furthermore, n is particularly preferably=1 or 2 if the group V is coordinated to M.

The bridging unit V may be neutral or singly negatively or singly positively charged. The charge of V here is preferably selected in such a way that a neutral complex arises overall. Thus, for example, a neutral bridging unit V is preferred in the case of a monovalent metal ion M$^+$ and three neutral and one singly negative (part) ligands L1, L2, L3 and L4. Furthermore, a singly negative bridging unit V is preferred in the case of a monovalent metal ion M$^+$ and four neutral (part) ligands L1, L2, L3 and L4. Furthermore, a singly positive bridging unit V is preferred in the case of a monovalent metal ion M$^+$ and two singly negative and two neutral (part) ligands L1, L2, L3 and L4. The corresponding situation applies if the metal ion has a different valence.

In a further preferred embodiment of the invention, the bridging unit V is selected from B, BR$^-$, CR, CO$^-$, SiR, N, NR$^+$, P or P(=O); or V is a cyclic group of one of the formulae (31) to (34):

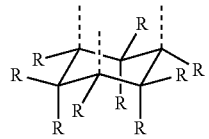

formula (31)

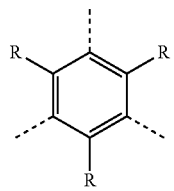

formula (32)

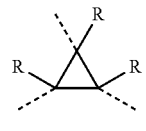

formula (33)

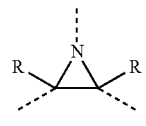

formula (34)

where the dashed bonds in each case indicate the bond to the part-ligands L1, L2 and L3 or to Y, and R has the meanings indicated above.

In a particularly preferred embodiment of the invention, the bridging unit V is selected from CR, N, P or P(=O); or V is a cyclic group of one of the above-mentioned formulae (31) to (34).

In a further preferred embodiment of the invention, L4 is selected from the group consisting of carbon monoxide, nitrogen monoxide, alkyl cyanides, such as, for example, acetonitrile, aryl cyanides, such as, for example, benzonitrile, alkyl isocyanides, such as, for example, methyl isonitrile, aryl isocyanides, such as, for example, benzoisonitrile, amines, such as, for example, trimethylamine, triethylamine, morpholine, phosphines, in particular halophosphines, trialkylphosphines, triarylphosphines or alkylarylphosphines, such as, for example, trifluorophosphine, trimethylphosphine, tricyclohexylphosphine, tri-tert-butylphosphine, triphenylphosphine, tris(pentafluorophenyl)phosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsine, tris(pentafluorophenyl)arsine, stibines, such as, for example, trifluorostibine, trimethylstibine, tricyclohexylstibine, tri-tert-butylstibine, triphenylstibine, tris(pentafluorophenyl)stibine, nitrogen-containing heterocycles, such as, for example, pyridine, pyridazine, pyrazine, pyrimidine, triazine, carbenes, in particular Arduengo carbenes, hydride, deuteride, the halides $F^-$, $Cl^-$, $Br^-$ and $I^-$, alkylacetylides, such as, for example, methyl-$C \equiv C^-$, tert-butyl-$C \equiv C^-$, arylacetylides, such as, for example, phenyl-$C \equiv C^-$, cyanide, cyanate, isocyanate, thiocyanate, isothiocyanate, aliphatic or aromatic alcoholates, such as, for example, methanolate, ethanolate, propanolate, isopropanolate, tert-butylate, phenolate, aliphatic or aromatic thioalcoholates, such as, for example, methanethiolate, ethanethiolate, propanethiolate, isopropane-thiolate, tert-butylthioate, thiophenolate, amides, such as, for example, dimethylamide, diethylamide, diisopropylamide, morpholide, carboxylates, such as, for example, acetate, trifluoroacetate, propionate, benzoate, anionic, nitrogen-containing heterocycles, such as pyrrolide, imidazolide, pyrazolide. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Preferred ligands or part-ligands L4 are furthermore the ligands of the following formulae (35) to (61)

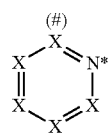

formula (35)

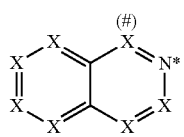

formula (36)

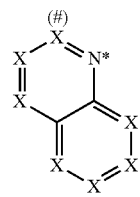

formula (37)

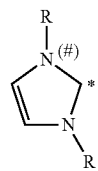

formula (38)

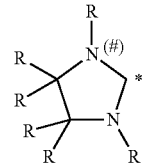

formula (39)

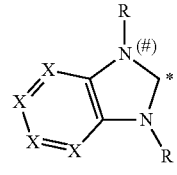

formula (40)

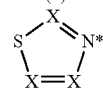

formula (41)

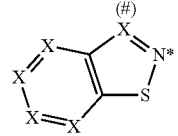

formula (42)

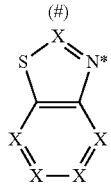

formula (43)

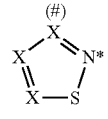

formula (44)

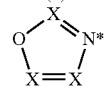

formula (45)

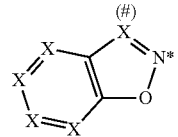

formula (46)

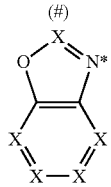

formula (47)

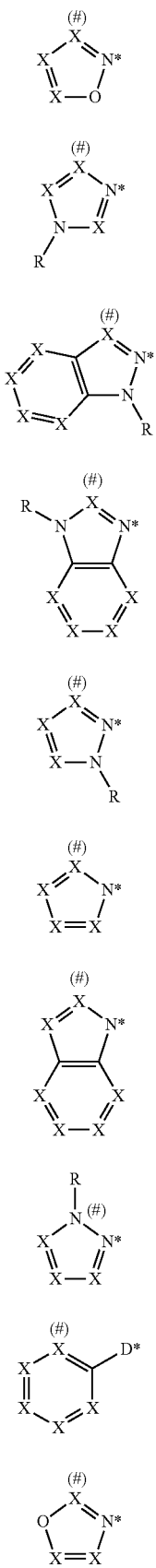

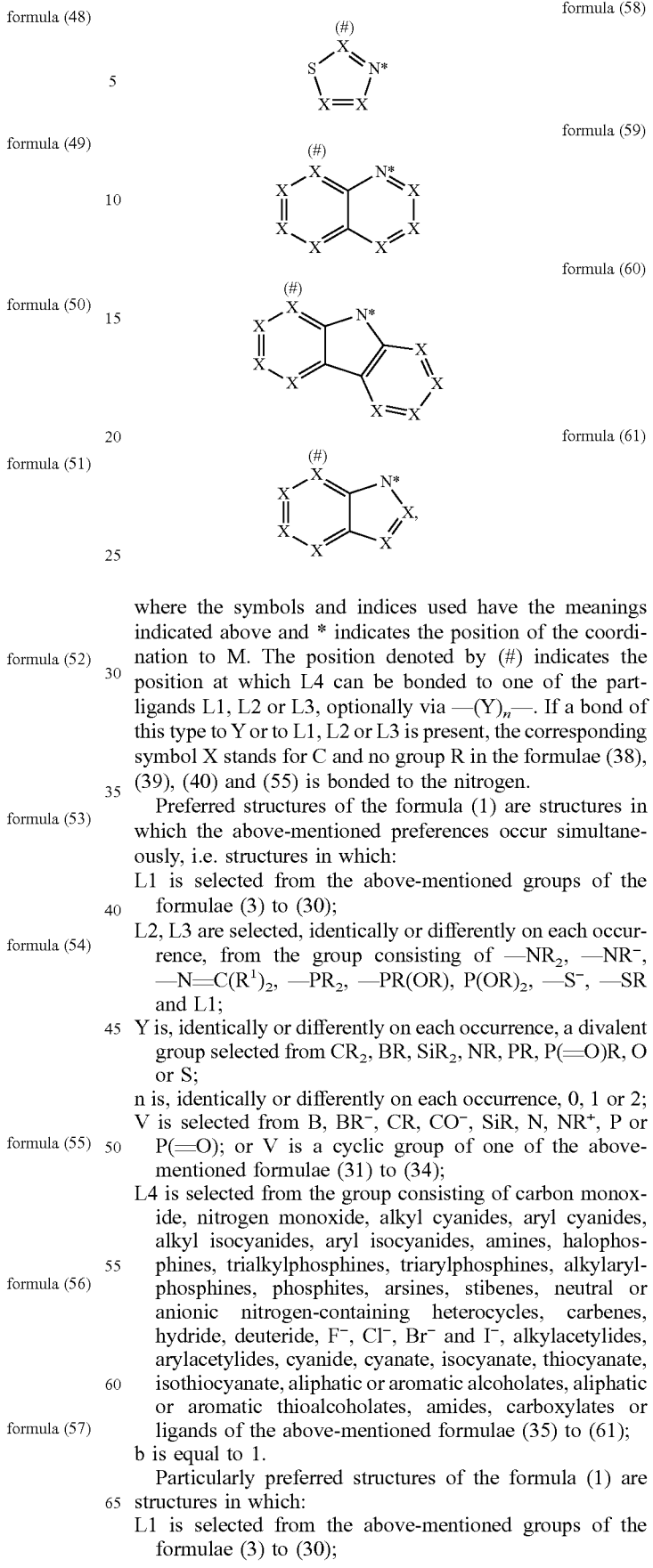

where the symbols and indices used have the meanings indicated above and * indicates the position of the coordination to M. The position denoted by (#) indicates the position at which L4 can be bonded to one of the part-ligands L1, L2 or L3, optionally via —(Y)$_n$—. If a bond of this type to Y or to L1, L2 or L3 is present, the corresponding symbol X stands for C and no group R in the formulae (38), (39), (40) and (55) is bonded to the nitrogen.

Preferred structures of the formula (1) are structures in which the above-mentioned preferences occur simultaneously, i.e. structures in which:

L1 is selected from the above-mentioned groups of the formulae (3) to (30);

L2, L3 are selected, identically or differently on each occurrence, from the group consisting of —NR$_2$, —NR$^-$, —N=C(R$^1$)$_2$, —PR$_2$, —PR(OR), P(OR)$_2$, —S$^-$, —SR and L1;

Y is, identically or differently on each occurrence, a divalent group selected from CR$_2$, BR, SiR$_2$, NR, PR, P(=O)R, O or S;

n is, identically or differently on each occurrence, 0, 1 or 2;

V is selected from B, BR$^-$, CR, CO$^-$, SiR, N, NR$^+$, P or P(=O); or V is a cyclic group of one of the above-mentioned formulae (31) to (34);

L4 is selected from the group consisting of carbon monoxide, nitrogen monoxide, alkyl cyanides, aryl cyanides, alkyl isocyanides, aryl isocyanides, amines, halophosphines, trialkylphosphines, triarylphosphines, alkylarylphosphines, phosphites, arsines, stibenes, neutral or anionic nitrogen-containing heterocycles, carbenes, hydride, deuteride, F$^-$, Cl$^-$, Br$^-$ and I$^-$, alkylacetylides, arylacetylides, cyanide, cyanate, isocyanate, thiocyanate, isothiocyanate, aliphatic or aromatic alcoholates, aliphatic or aromatic thioalcoholates, amides, carboxylates or ligands of the above-mentioned formulae (35) to (61);

b is equal to 1.

Particularly preferred structures of the formula (1) are structures in which:

L1 is selected from the above-mentioned groups of the formulae (3) to (30);

L2, L3 are, identically or differently on each occurrence, L1;
Y is, identically or differently on each occurrence, a divalent group selected from $CR_2$, $SiR_2$, NR, O or S, preferably $CR_2$;
n is, identically or differently on each occurrence, 0 or 1;
V is selected from CR, $CO^-$, N, $NR^+$, P or P(=O); or V is a cyclic group of one of the above-mentioned formulae (31) to (34);
L4 is selected from the group consisting of carbon monoxide, nitrogen monoxide, alkyl cyanides, aryl cyanides, alkyl isocyanides, aryl isocyanides, amines, halophosphines, trialkylphosphines, triarylphosphines, alkylarylphosphines, phosphites, arsines, stibenes, neutral or anionic nitrogen-containing heterocycles, carbenes, hydride, deuteride, $F^-$, $Cl^-$, $Br^-$ and $I^-$, alkylacetylides, arylacetylides, cyanide, cyanate, isocyanate, thiocyanate, isothiocyanate, aliphatic or aromatic alcoholates, aliphatic or aromatic thioalcoholates, amides, carboxylates or ligands of the above-mentioned formulae (35) to (61);
b is equal to 1.

The other symbols and indices used in each case have the meanings indicated above.

In a preferred embodiment of the invention, the ligand L4 is linked to at least one of the part-ligands L1, L2 and/or L3 via a direct bond or via a group —$(Y)_n$—. The ligand L thus has a structure of one of the formulae (62) to (66), where the symbols and indices used have the meanings indicated above:

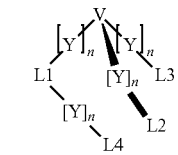
formula (62)

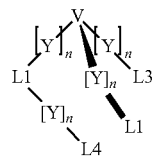
formula (63)

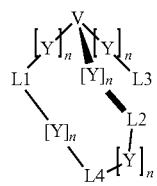
formula (64)

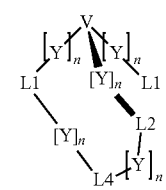
formula (65)

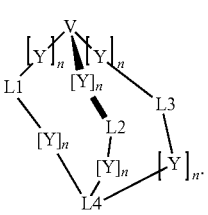
formula (66)

The same preferences as indicated above for structures of the formula (1) apply to complexes containing the above-mentioned structures of the formulae (62) to (66) as ligands.

The part-ligand L4 in the structures of the formula (62) or (63) is particularly preferably defined, identically or differently, as the above definition of the part-ligands L1 to L3 or as above structures (35) to (61).

The part-ligand L4 in structures of the formula (64) or (65) is particularly preferably selected from the group consisting of —NR—, —$N^-$—, —PR—, —P(OR)—, —S— or part-ligands of the following formulae (67) to (90):

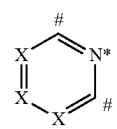
formual (67)

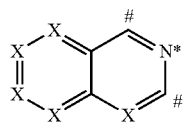
formula (68)

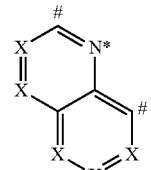
formula (69)

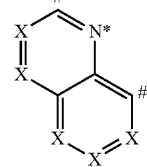
formula (70)

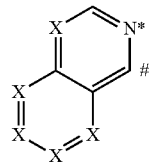
formual (71)

formual (72)

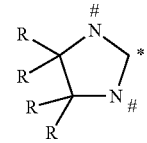
formula (73)

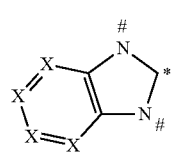
formula (74)

formula (75)
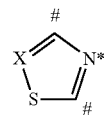

formula (76)
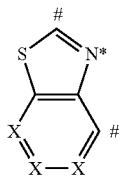

formula (77)
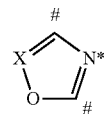

formula (78)
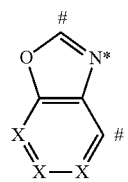

formula (79)
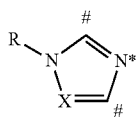

formula (80)
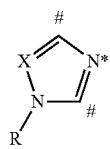

formula (81)
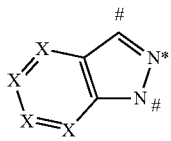

formula (82)
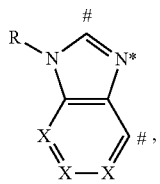

formula (83)
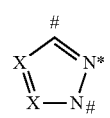

formula (84)
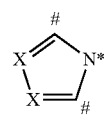

formula (85)
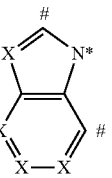

formula (86)
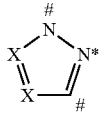

formula (87)
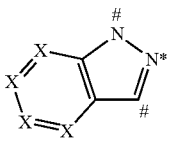

formula (88)
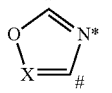

formula (89)
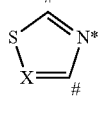

formula (90)
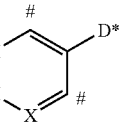

where the symbols used have the same meanings as described above. The position denoted by # indicates the position at which the part-ligand L4 is bonded to two of the part-ligands L1, L2 or L3, optionally via —(Y)$_n$—.

The part-ligand L4 in structures of the formula (66) is particularly preferably N or P.

Preference is furthermore given to compounds of the formula (1) or complexes containing ligands of the formulae (62) to (66) or in accordance with the preferred embodiments mentioned above in which R stands on each occurrence, identically or differently, for H, D, F, CN, a straight-chain alkyl or alkoxy group having 1 to 6 C atoms or a branched or cyclic alkyl or alkoxy group having 3 to 6 C atoms, each of which may be substituted by one or more radicals R$^1$, where one or more non-adjacent CH$_2$ groups may be replaced by R$^1$C=CR$^1$, O or S and one or more H atoms may be replaced by D or F, or an aromatic or heteroaromatic ring system having 5 to 18 aromatic ring atoms, which may in each case be substituted by one or more radicals R$^1$, or a diarylamino group having 10 to 20 aromatic ring atoms, which may be substituted by one or more radicals R$^1$, or a combination of these systems; two or more substituents R may also form a mono- or polycyclic aliphatic, aromatic and/or benzo-fused ring system with one another. The symbol R in these compounds particularly preferably stands, identically or differently on each occurrence, for H, D, F, a straight-chain alkyl group having 1 to 4 C atoms or a branched alkyl group having 3 or 4 C atoms, which may in each case be substituted by one or more radicals R¹, where one or more H atoms may be replaced by F, or an aryl group having 6 to 10 aromatic ring or an aromatic ring system having 12 to 18 aromatic ring atoms, which may in each case be substituted by one or more radicals R¹; two or more substituents R here may also form a mono- or polycyclic aliphatic, aromatic and/or benzo-fused ring system with one another.

Preference is furthermore given to symmetrical compounds, in particular compounds in which the part-ligands L1 and L2 are identical and are also identically substituted or in which the part-ligands L1, L2 and L3 are identical and are also identically substituted.

The complexes of the formula (1) or complexes containing ligands of the formulae (62) to (66) or in accordance with the preferred embodiments mentioned above can in principle be prepared by various processes, but the processes described below have proven particularly suitable.

The present invention therefore furthermore relates to a process for the preparation of the complexes of the formula (1) by reaction of the ligands L of the formula (2) with metal salts or metal complexes of the corresponding metal M. Examples of suitable copper compounds which can be employed as starting materials are CuF, CuCl, CuBr, CuI, Cu(OAc), Cu₂(CO₃) or Cu(CH₃CN)PF₆. Examples of suitable gold compounds which can be employed as starting materials are AuHal.SR₂, where Hal stands for a halide and R stands for an alkyl group having 1 to 5 C atoms.

The synthesis can also be activated thermally, photochemically or by microwave radiation. These processes enable the complexes to be obtained in high purity, preferably in a purity of >99% pure according to ¹H-NMR or HPLC.

Examples of preferred compounds of the formula (1) are the compounds depicted below. These complexes can be prepared, inter alia, by the synthetic methods explained above.

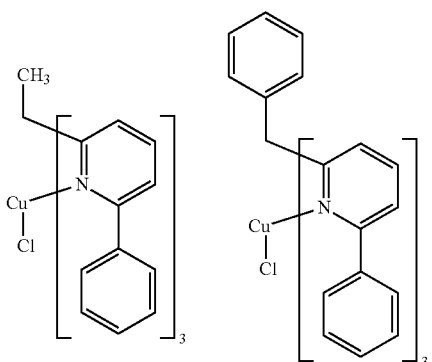

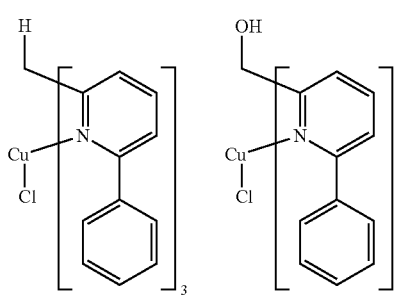

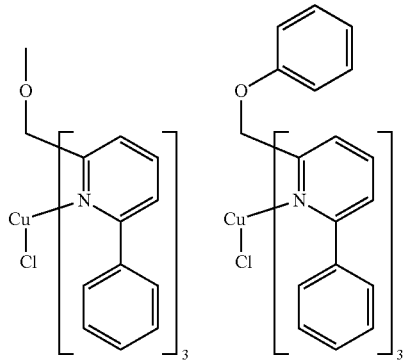

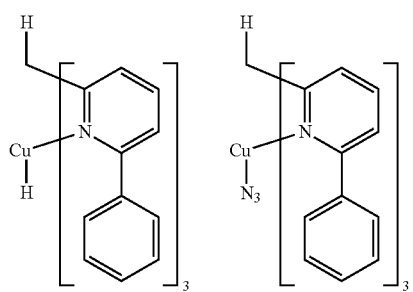

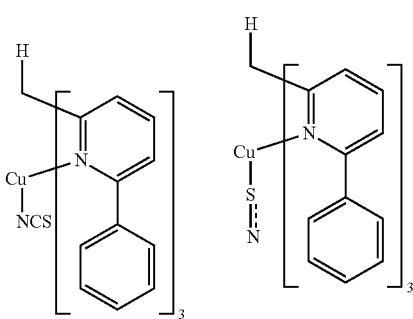

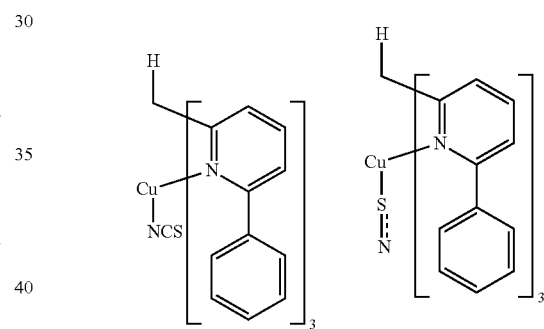

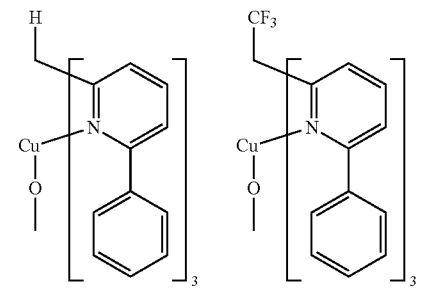

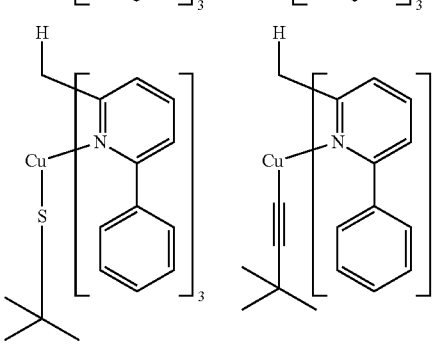

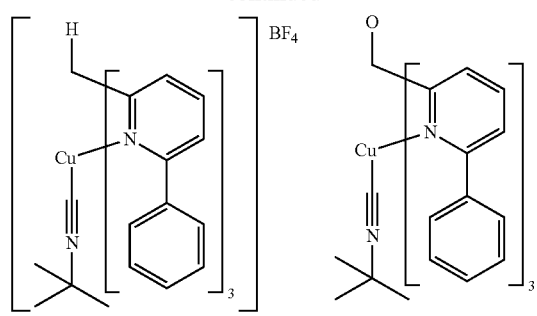
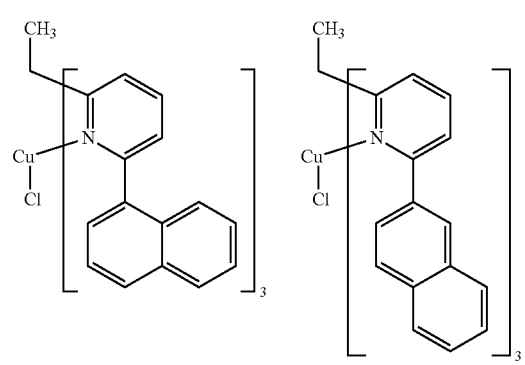
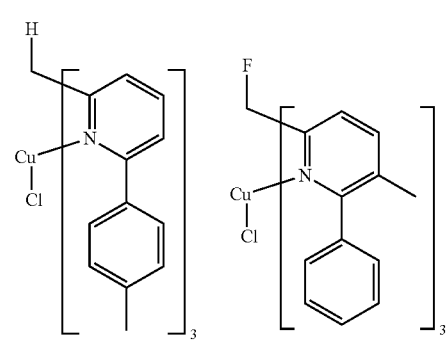
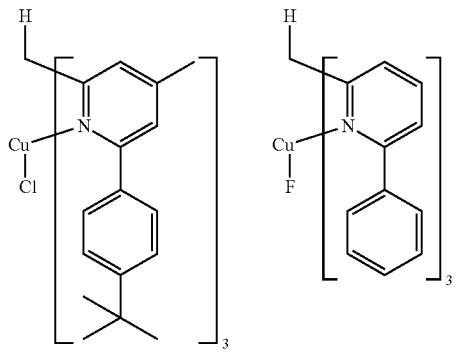
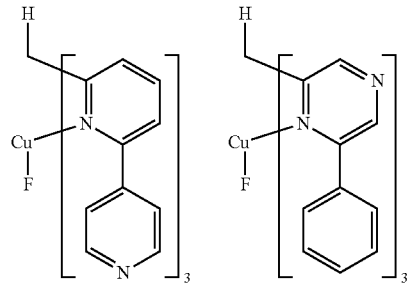
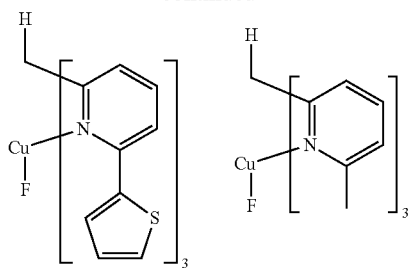
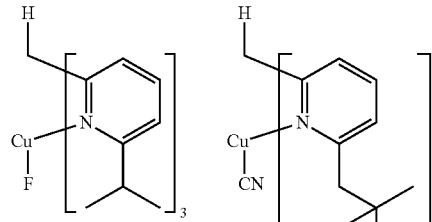
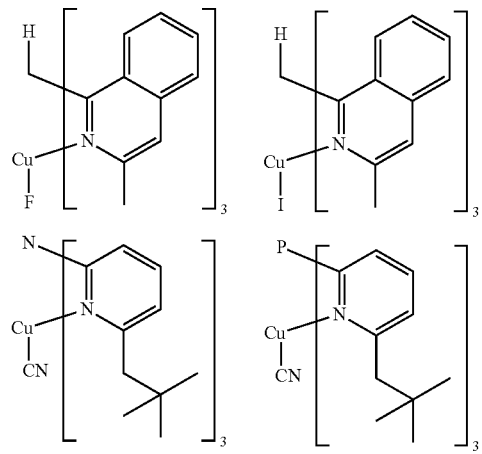
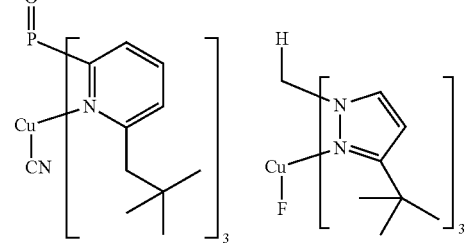
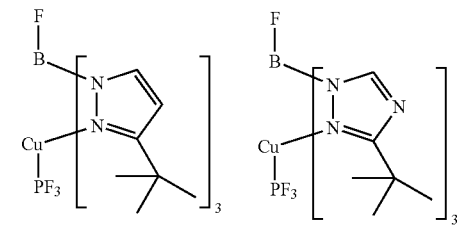
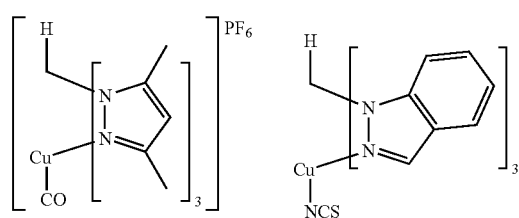

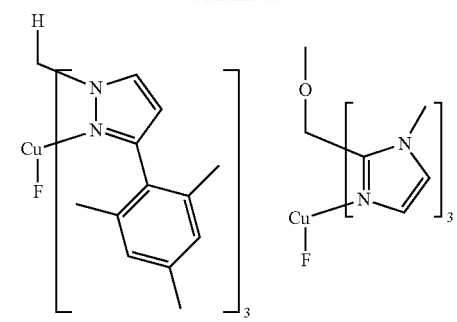
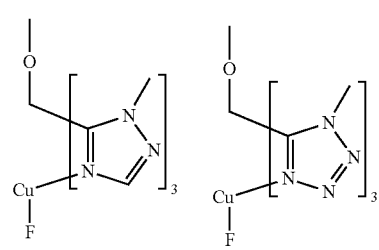
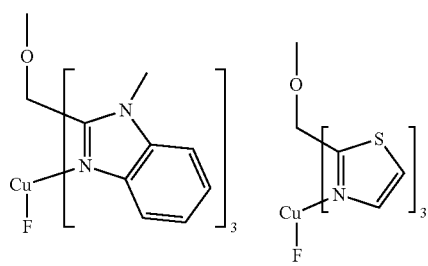
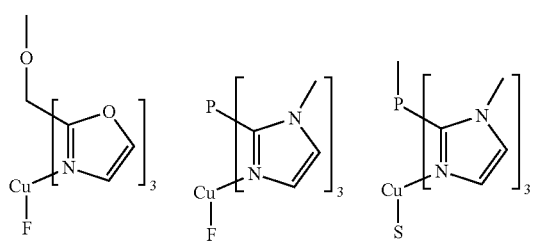
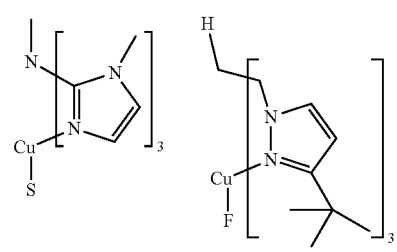
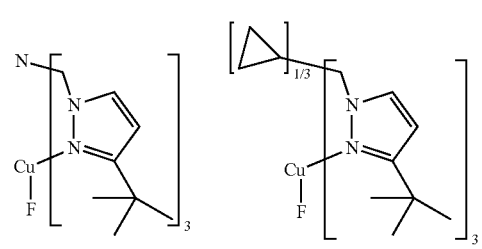
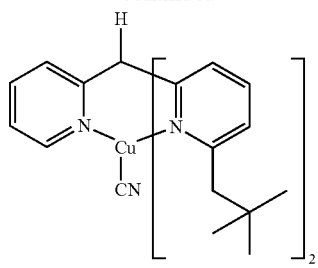
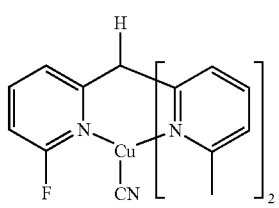
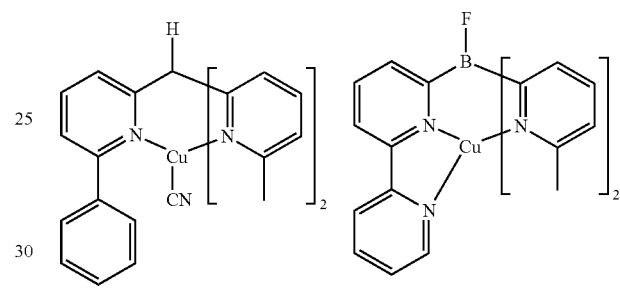
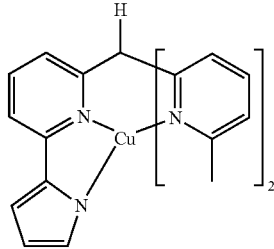
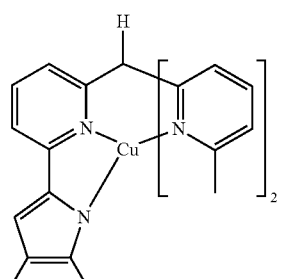
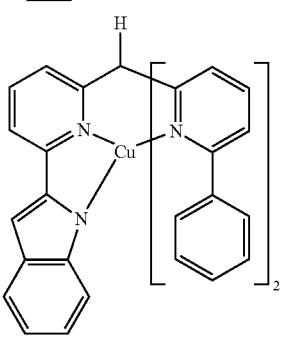

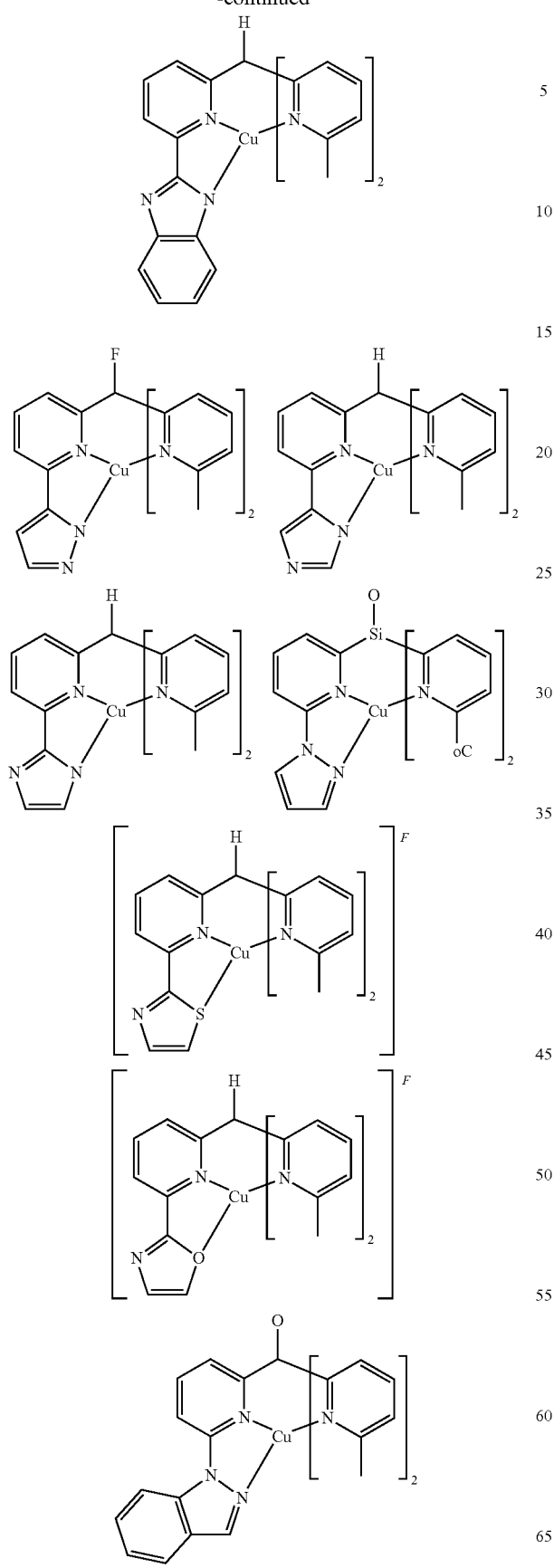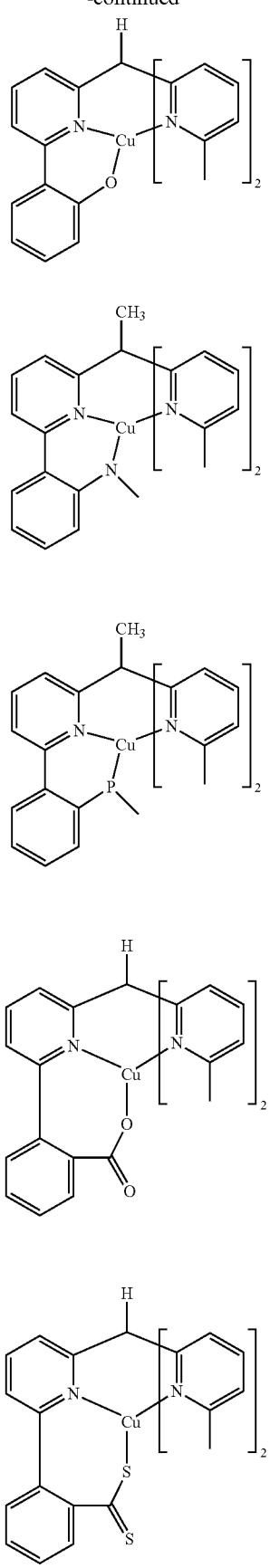

-continued

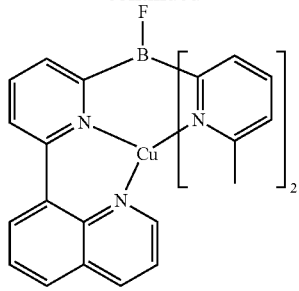
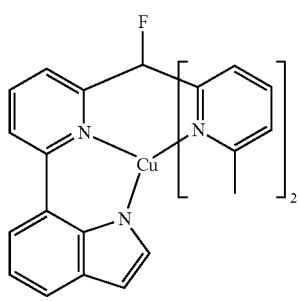
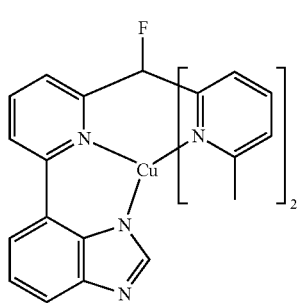
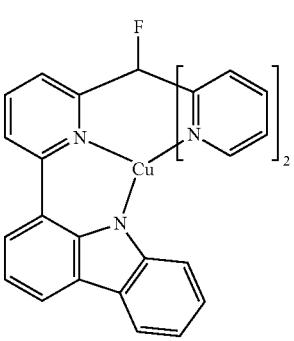
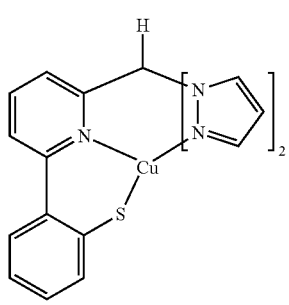

-continued

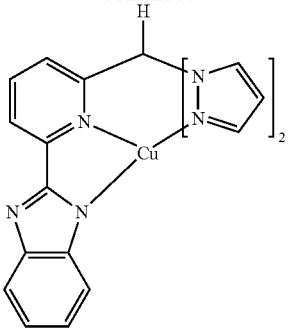
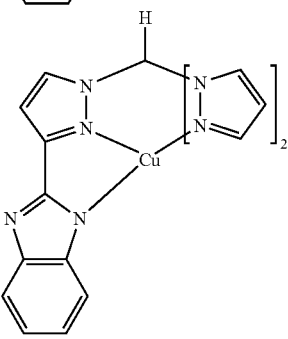
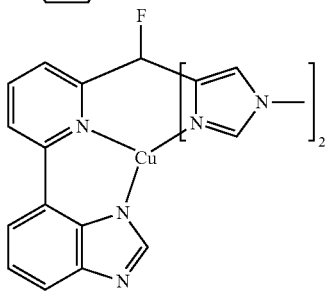

The complexes described above are used in accordance with the invention as active component in electronic devices, such as, for example, organic electroluminescent devices (=Organic light-emitting diodes, OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) or organic laser diodes (O-lasers).

Active components are, for example, charge-injection, charge-transport or charge-blocking materials, but in particular emission materials and matrix materials. The compounds of the formula (1) or the preferred embodiments mentioned above exhibit particularly good properties for these functions, in particular as emission material, as described in greater detail below.

In a preferred embodiment of the invention, the electronic device is therefore selected from the group consisting of organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) or organic laser diodes (O-lasers), but in particular organic electroluminescent devices (OLEDs, PLEDs), comprising one or more compounds of the formula (1). Preference is given to organic electroluminescent devices comprising one or more compounds of the formula (1) or the preferred embodiments mentioned above.

The organic electroluminescent device comprises a cathode, an anode and at least one emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers and/or charge-generation layers. It is likewise possible for interlayers which have, for example, an exciton-blocking function to be introduced between two emitting layers. However, it should be pointed out that each of these layers does not necessarily have to be present.

In a preferred embodiment of the invention, the compound of the formula (1) or the preferred embodiments mentioned above is employed as emitting compound in an emitting layer. The organic electroluminescent device here may comprise one emitting layer or a plurality of emitting layers, where at least one emitting layer comprises at least one compound of the formula (1) or the preferred embodiments mentioned above. If a plurality of emission layers is present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems (three emitting layers), where the three layers exhibit blue, green and orange or red emission (for the basic structure, see, for example, WO 05/011013).

If the compound of the formula (1) or the preferred embodiments mentioned above is employed as emitting compound in an emitting layer, it is preferably employed in combination with one or more matrix materials. The mixture of the compound of the formula (1) or the preferred embodiments mentioned above and the matrix material comprises between 1 and 99% by weight, preferably between 2 and 90% by weight, particularly preferably between 3 and 40% by weight, in particular between 5 and 15% by weight, of the compound of the formula (1) or the preferred embodiments mentioned above, based on the mixture as a whole comprising emitter and matrix material. Correspondingly, the mixture comprises between 99 and 1% by weight, preferably between 98 and 10% by weight, particularly preferably between 97 and 60% by weight, in particular between 95 and 85% by weight, of the matrix material, based on the mixture as a whole comprising emitter and matrix material.

Suitable matrix materials for the compounds according to the invention, which can be employed individually or as a mixture of two or more of these materials, are ketones, phosphine oxides, sulfoxides and sulfones, for example in accordance with WO 04/013080, WO 04/093207, WO 06/005627 or WO 2010/006680, triarylamines, carbazole derivatives, for example CBP (N,N-biscarbazolylbiphenyl) or the carbazole derivatives disclosed in WO 05/039246, US 2005/0069729, JP 2004/288381, EP 1205527 or WO 08/086, 851, indolocarbazole derivatives, for example in accordance with WO 07/063,754 or WO 08/056,746, indenocarbazole derivatives, for example in accordance with the unpublished applications DE 102009023155.2 and DE 102009031021.5, azacarbazoles, for example in accordance with EP 1617710, EP 1617711, EP 1731584, JP 2005/347160, bipolar matrix materials, for example in accordance with WO 07/137,725, silanes, for example in accordance with WO 05/111172, azaboroles or boronic esters, for example in accordance with WO 06/117052, triazine derivatives, for example in accordance with WO 2010/015306, WO 07/063,754, WO 08/056, 746 or the unpublished application DE 102009048791.3, zinc complexes, for example in accordance with EP 652273 or WO 09/062,578, diaza- or tetraazasilole derivatives, for example in accordance with WO 2010/054729, or diazaphosphole derivatives, for example in accordance with WO 2010/054730.

It is also possible to employ two or more luminescent metal complexes, where the metal complex which emits at shorter wavelength serves as co-host for the metal complex which emits at longer wavelength.

It may furthermore also be preferred to employ a charge-transporting host-material together with a host material which is not involved in the charge transport, for example in accordance with the unpublished application DE 102009014513.3.

In a further preferred embodiment of the invention, the compound of the formula (1) or the preferred embodiments mentioned above is employed as matrix material for an emitting compound in an emitting layer. The organic electroluminescent device here may comprise one emitting layer or a plurality of emitting layers, where at least one emitting layer comprises at least one compound of the formula (1) or the preferred embodiments mentioned above as matrix material. If a plurality of emission layers are present, the above-said applies to them. If the compound of the formula (1) or the preferred embodiments mentioned above is employed as matrix material for an emitting compound in an emitting layer, it is preferably employed in combination with one or more fluorescent or phosphorescent materials.

In a further preferred embodiment of the invention, the compound of the formula (1) or the preferred embodiments mentioned above is employed as hole-blocking material in a hole-blocking layer and/or as electron-transport material in an electron-transport layer. The emitting layer here may be fluorescent or phosphorescent.

In a further preferred embodiment of the invention, the compound of the formula (1) or the preferred embodiments mentioned above is employed as hole-transport material in a hole-transport or -injection layer and/or as electron-blocking material in an electron-blocking layer. The emitting layer here may be fluorescent or phosphorescent.

Preference is furthermore given to an organic electroluminescent device, characterised in that one or more layers are applied by means of a sublimation process, in which the materials are vapour-deposited in vacuum sublimation units at an initial pressure of usually below $10^{-5}$ mbar, preferably below $10^{-6}$ mbar. However, it is also possible for the initial pressure to be even lower, for example below $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or inkjet printing. Soluble compounds, which are obtained, for example, by suitable substitution, are necessary for this purpose.

Likewise possible are hybrid processes, in which, for example, one or more layers are applied from solution and one or more other layers are applied by vapour deposition. Thus, it is possible, for example, to apply an emitting layer from solution and to apply an electron-transport layer on top by vapour deposition.

These processes are generally known to the person skilled in the art and can be applied by him without problems to electronic devices comprising compounds of the formula (1) or the preferred embodiments mentioned above.

The preferred compounds mentioned above in which the ligand L4 is linked to at least one of the part-ligands L1, L2 and/or L3, i.e. metal complexes containing the ligands of the formulae (62) to (66), are novel and are therefore a further subject-matter of the present invention.

The invention therefore furthermore relates to a compound of the formula ML' containing a metal M coordinated to a ligand L', where the ligand L' conforms to one of the formulae (62) to (66) and each of the part-ligands L1, L2, L3 and L4 is coordinated to M:

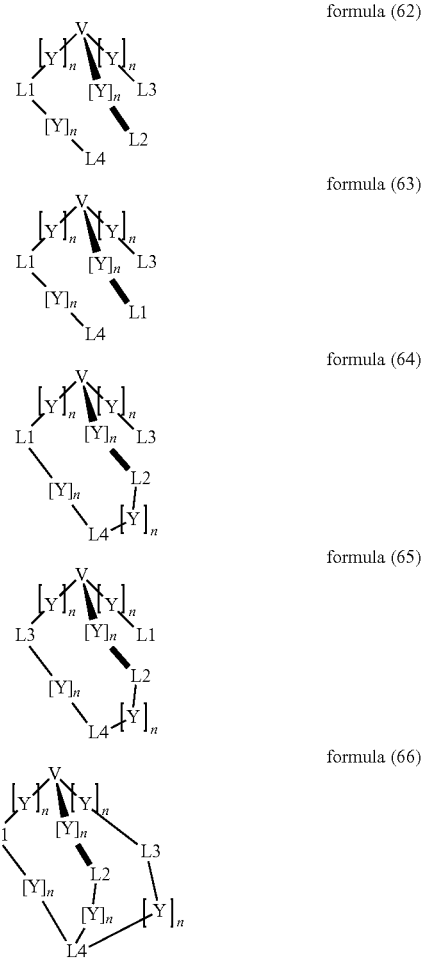

where the symbols and indices used have the meanings indicated above. Preferred embodiments here are the embodiments of the invention that have already been mentioned above.

The invention furthermore relates to the use of a compound ML' containing a ligand of one of the formulae (62) to (66) in an electronic device.

The electronic devices according to the invention and the compounds according to the invention are distinguished by the following surprising advantages over the prior art:

1. In contrast to many metal complexes in accordance with the prior art which undergo partial or complete pyrolytic decomposition on sublimation, the compounds according to the invention have high thermal stability.
2. Organic electroluminescent devices comprising compounds of the formula (1) as emitting materials have a long lifetime.
3. Blue-luminescent complexes which have a long lifetime on use in organic electroluminescent devices are accessible. This is a significant advance over the prior art, since blue-luminescent metal complexes were hitherto only accessible with poor colour coordinates and in particular a poor lifetime.
4. The compounds according to the invention, employed in organic electroluminescent devices, result in high efficiencies and in steep current/voltage curves.
5. The compounds of the formula (1) are not based on the rare metal iridium, which contributes to conservation of the resources of this metal.
6. Since the complexes are not ortho-metallated complexes, the complexes of the formula (1) or the preferred embodiments mentioned above are synthetically accessible readily and in high yields and high purities.

The advantages mentioned above are not accompanied by an impairment in the other electronic properties.

The invention is explained in greater detail by the following examples, without wishing to restrict it thereby. The person skilled in the art will be able to use the descriptions to prepare further complexes according to the invention without an inventive step and use them in organic electronic devices or use the process according to the invention and thus carry out the invention throughout the range claimed.

EXAMPLES

The following syntheses are carried out, unless indicated otherwise, under a protective-gas atmosphere in dried solvents. The solvents and reagents can be purchased from ALDRICH or ABCR. The numbers indicated in the following syntheses for the starting materials known from the literature are the CAS numbers of these compounds.

Example 1

Cu Complex 1

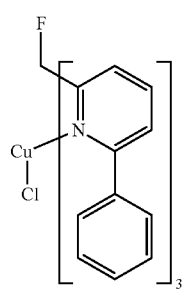

A): Tris(6-phenylpyridin-2-yl)fluoromethane

809 mg (4 mmol) of tris-tert-butylphosphine and then 674 mg (3 mmol) of palladium(II) acetate are added to a mixture of 50.2 g (100 mmol) of tris(6-bromopyridin-2-yl)fluoromethane [760177-68-2], 61.0 g (500 mmol) of phenylboronic acid, 58.1 g (1 mol) of potassium fluoride, anhydrous, in 1000 ml of THF, and the mixture is subsequently stirred under reflux for 5 h. After cooling, 300 ml of water are added to the reaction mixture, the aqueous phase is separated off, and the organic phase is filtered through Celite and evaporated to dryness. The solid obtained in this way is recrystallised twice from chloroform (about 50 ml) with addition of ethanol (about 200 ml). Yield: 38.5 g (78 mmol), 78%, 99.0% pure according to $^1$H-NMR.

B): Cu Complex 1

A mixture of 4.9 g (10 mmol) of tris(6-phenylpyridin-2-yl)fluoromethane, 1.0 g (10 mmol) of copper(I) chloride in 50 ml of THF is stirred at 60° C. for 24 h. The reaction mixture is evaporated to a volume of 5 ml in vacuo, 20 ml of methanol are added, and the precipitated solid is filtered off with suction, washed three times with 10 ml of methanol each time and dried in vacuo. Yield: 3.9 g (6.6 mmol), 66%, 99.5% pure according to $^1$H-NMR.

The following compounds are obtained analogously by using the corresponding Cu salts (table).

| Ex. No. | Cu(I) salt | Complex | Yield [%] |
|---|---|---|---|
| Cu complex 2 | CuBr | (structure with CuBr) | 61 |
| Cu complex 3 | CuI | (structure with CuI) | 66 |
| Cu complex 4 | CuCN | (structure with CuCN) | 73 |
| Cu complex 5 | CuSCH$_3$ [4856-13-7] | (structure with Cu–S–CH$_3$) | 56 |
| Cu complex 6 | Cu—≡—CH$_3$ [30645-13-7] | (structure with Cu–C≡C–CH$_3$) | 43 |

Example 7

Cu Complex 7

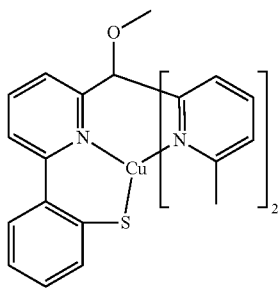

A): (6-Bromopyridin-2-yl)bis(6-methylpyridin-2-yl)methanol

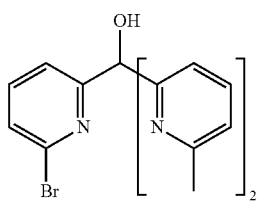

40.0 ml (100 mmol) of n-butyllithium (2.5 N) are added dropwise to a suspension, cooled to −78° C., of 26.1 g (110 mmol) of 2,6-dibromopyridine in 150 ml of diethyl ether, and the mixture is stirred at −78° C. until a yellow solution forms. This solution is diluted dropwise with 200 ml of diethyl ether, and a solution of 23.3 g (110 mmol) of bis(6-methyl-2-pyridinyl)methanone in 80 ml of THF is then added in one portion with vigorous stirring. After warming to 0° C., a mixture of 50 ml of water and 6 ml of glacial acetic acid is added dropwise, and the precipitated solid is then filtered off with suction, washed once with 25 ml of diethyl ether and once with 25 ml of ethanol and dried in vacuo. Yield: 17.8 g (48 mmol), 48%, 98% pure according to $^1$H-NMR.

B): (6-Bromopyridin-2-yl)bis(6-methylpyridin-2-yl)methoxymethane

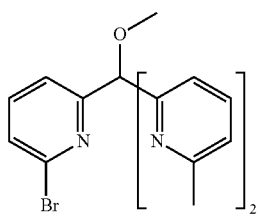

A solution of 18.5 g (50 mmol) of (6-bromopyridin-2-yl)bis(6-methylpyridin-2-yl)methanol in 50 ml of DMF is added at 40° C. to a suspension of 1.4 g (60 mmol) of sodium hydride in 50 ml of DMF, and the mixture is stirred for a further 30 min. A mixture of 8.5 g (60 mmol) of methyl iodide and 10 ml of DMF is then added, the mixture is stirred at room temperature for a further 20 h, 5 ml of ethanol are added dropwise, the mixture is diluted with 500 ml of dichloromethane, the org. phase is washed five times with 300 ml of water each time, the organic phase is dried over magnesium sulfate, and the solvent is then stripped off completely in vacuo. The residue is recrystallised from ethanol with addition of a little ethyl acetate. Yield: 16.5 g (43 mmol), 86% pure according to $^1$H-NMR.

C): (6-(Phenyl-2-thiol)pyridin-2-yl)bis(6-methylpyridin-2-yl)methoxymethane

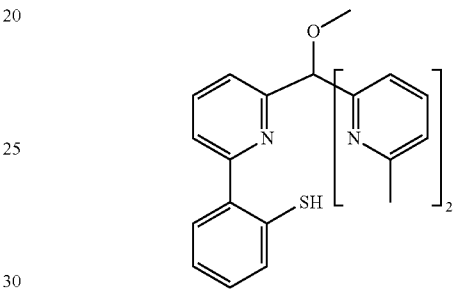

405 mg (2 mmol) of tris-tert-butylphosphine and then 337 mg (1.5 mmol) of palladium(II) acetate are added to a mixture of 38.4 g (100 mmol) of (6-bromopyridin-2-yl)bis(6-methylpyridin-2-yl)methoxymethane, 41.9 g (130 mmol) of diisopropyl [2-tetrahydro-2H-pyran-2-yl]thio]phenylboronate [620988-03-6], 19.2 g (330 mmol) of potassium fluoride (anhydrous) in 500 ml of THF, and the mixture is subsequently stirred under reflux for 5 h. After cooling, 300 ml of water and 15 ml of glacial acetic acid are added to the reaction mixture, the mixture is stirred at 50° C. for 2 h, the aqueous phase is separated off, and the organic phase is filtered through Celite and evaporated to dryness. The solid obtained in this way is recrystallised from acetone (20 ml) with addition of ethanol (150 ml). Yield: 27.3 g (66 mmol), 66%, 99.0% pure according to $^1$H-NMR.

D): Cu Complex 7

10.0 ml (10 mmol) of sodium methoxide solution, 1 N in methanol, are added to a solution of 4.1 g (10 mmol) of (6-(phenyl-2-thiol)pyridin-2-yl)bis(6-methylpyridin-2-yl)methoxymethane in 50 ml of THF, and the mixture is stirred at 40° C. for 1 h. 1.0 g (10 mmol) of solid copper(I) chloride is then added, and the mixture is stirred for a further 24 h. The reaction mixture is evaporated to a volume of 5 ml in vacuo, 50 ml of methanol are added, and the precipitated solid is filtered off with suction, washed three times with 10 ml of methanol each time and dried in vacuo. After recrystallisation twice from DMSO/isopropanol, the product is sublimed in a high vacuum (p=1×10$^{-6}$ mbar, T=320° C.). Yield: 3.4 g (7.0 mmol), 71%, 99.8% pure according to HPLC.

Example 8

Cu Complex 8

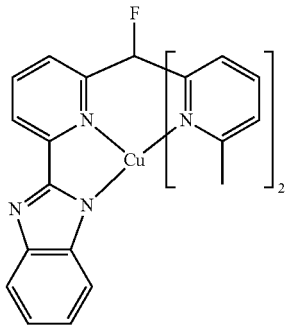

A): (6-Bromopyridin-2-yl)bis(6-methylpyridin-2-yl)fluoromethane

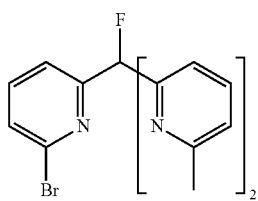

46.6 g (350 mmol) of dimethylaminosulfur trifluoride are added with stirring to a solution of 37.0 g (100 mmol) of (6-bromopyridin-2-yl)bis(6-methylpyridin-2-yl)methanol in 300 ml of chloroform, and the mixture is then stirred under reflux for 1 h. After the reaction mixture has been cooled to +5° C., a solution of 65 g of sodium hydroxide in 500 ml of water is slowly added (note: exothermic!), the mixture is stirred for a further 30 min., the aqueous phase is separated off, and the organic phase is dried over calcium chloride. After removal of the solvent in vacuo, the oil is taken up in 100 ml of hot methanol, the mixture is cooled, and the colourless solid is filtered off with suction, washed once with 30 ml of methanol and dried in vacuo. Yield: 33.1 g (8.9 mmol), 89%, 97% pure according to $^1$H-NMR.

B): (6-Formylpyridin-2-yl)bis(6-methylpyridin-2-yl)fluoromethane

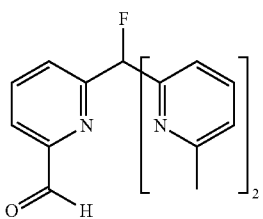

20 ml (50 mmol) of n-butyllithium (2.5 N in hexane) are added rapidly to a solution, cooled to −78° C., of 16.6 g (50 mmol) of 6-bromopyridin-2-yl)bis(6-methylpyridin-2-yl)fluoromethane in 200 ml of THF, and the mixture is stirred at −78° C. for 10 min. 4.4 g (60 mmol) of DMF in 10 ml of THF are then added in one portion, and the mixture is stirred for a further 30 min. and then allowed to warm to room temperature. 55 ml of 1 N hydrochloric acid are added, and the mixture is stirred for a further 1 h and evaporated to dryness in vacuo. The residue is taken up in 500 ml of dichloromethane, the solution is washed with 100 ml of 1 N sodium hydroxide solution and then with 100 ml of water, the organic phase is dried over magnesium sulfate, the organic phase is evaporated to about 30 ml in vacuo, 100 ml of isopropanol are added, the mixture is stirred for a further 1 h, and the precipitated solid is filtered off with suction, washed with methanol and dried in vacuo. Yield: 10.3 g (32 mmol), 64%, 95.0% pure according to $^1$H-NMR.

C): (6-(Benzimidazol-2-yl)pyridin-2-yl)bis(6-methylpyridin-2-yl)fluoromethane

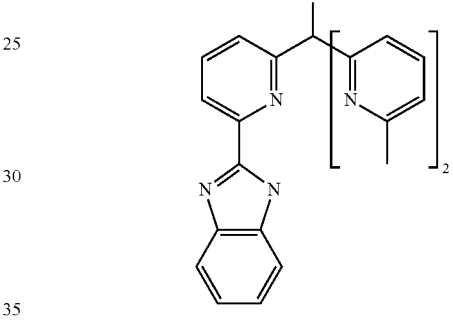

3.0 ml of thionyl chloride are added dropwise to a suspension of 12.0 g of silica gel in 50 ml of dichloromethane, and the mixture is then stirred at room temperature for 1 h. A solution of 6.4 g (20 mmol) of (6-formylpyridin-2-yl)bis(6-methylpyridin-2-yl)fluoromethane and 2.4 g (22 mmol) of o-phenylenediamine is subsequently added dropwise, and the mixture is stirred for a further 6 h. 50 ml of dichloromethane and 50 ml of ethanol are added, the mixture is filtered through silica gel with suction, the latter is rinsed with dichloromethane, the organic phase is evaporated in vacuo, and the residue is recrystallised from about 50 ml of ethanol with addition of 5 ml of triethylamine. Yield: 4.9 g (12 mmol), 60%, 99.0% pure according to $^1$H-NMR.

D): Cu Complex 8

1.3 g (10 mmol) of diisopropylethylamine are added to a mixture of 4.1 g (10 mmol) of (6-(benzimidazol-2-yl)pyridin-2-yl)bis(6-methylpyridin-2-yl)fluoromethane and 1.0 g (10 mmol) of copper(I) chloride in 50 ml of THF, and the mixture is stirred at 40° C. for 24 h. The reaction mixture is evaporated to a volume of 5 ml in vacuo, 30 ml of methanol are added, and the precipitated solid is filtered off with suction, washed three times with 10 ml of methanol each time and dried in vacuo. After recrystallisation twice from acetonitrile, the product is sublimed in a high vacuum ($p=1\times10^{-6}$ mbar, T=310° C.). Yield: 3.3 g (7.0 mmol), 70%, 99.9% pure according to HPLC.

Example 9

Cu Complex 9

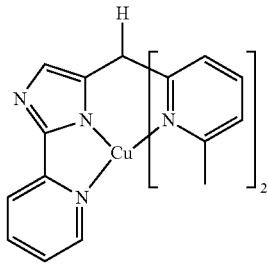

A): 2-(1-Methoxymethyl-1H-imidazol-2-yl)pyridine

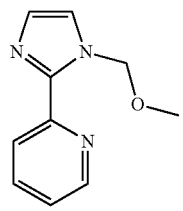

600 ml of toluene, 84.2 g (580 mmol) of 1H-imidazol-2-ylpyridine [18653-75-3] and 14.8 g (40 mmol) of tetrabutylammonium bromide are added to a solution of 400.0 g (10 mol) of sodium hydroxide in 400 ml of water at room temperature with vigorous stirring, a mixture of 50.0 g (621 mmol) of chloromethyl methyl ether and 100 ml of toluene is then slowly added dropwise, and the mixture is stirred at room temperature for a further 16 h. The reaction mixture is extended with 800 ml of toluene and 800 ml of water, the organic phase is separated off and dried over magnesium sulfate, and the solvent is removed in vacuo. Yield: 99.0 g (90 mmol), 98%, 96% pure according to $^1$H-NMR.

B): Bis(6-methylpyridin-2-yl)-(1-methoxymethyl-2-pyridin-2-yl-3H-imidazol-4-yl)methanol

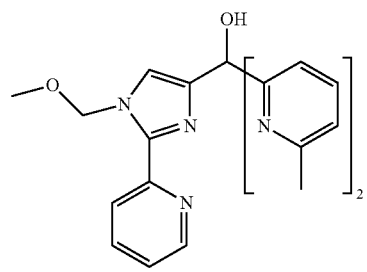

40 ml (100 mmol) of n-butyllithium (2.5 M in hexane) are added dropwise to a solution, cooled to −78° C., of 18.9 g (100 mmol) of 2-(1-methoxymethyl-1H-imidazol-2-yl)pyridine in 500 ml of THF, and the mixture is stirred for a further 30 min. A solution of 21.2 g (100 mmol) of bis(6-methyl-2-pyridinyl)methanone in 50 ml of THF is subsequently added in one portion, and the reaction mixture is allowed to warm to room temperature. After addition of a mixture of 100 ml of water and 6.0 ml of glacial acetic acid, the mixture is stirred for a further 1 h, and the organic phase is then separated off, dried over potassium carbonate and then evaporated to dryness in vacuo. Yield: 23.0 g (57 mmol), 57%, 95.0% pure according to $^1$H-NMR.

C): Bis(6-methylpyridin-2-yl)-(2-pyridin-2-yl-3H-imidazol-4-yl)methane

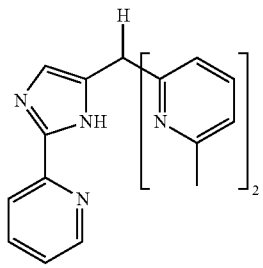

20.1 g (50 mmol) of bis(6-methylpyridin-2-yl)-(1-methoxymethyl-2-pyridin-2-yl-3H-imidazol-4-yl)methanol are suspended in 300 ml of glacial acetic acid. 20 ml of aqueous hypophosphorous acid (50% by weight) and 40 ml of aqueous hydroiodic acid (57% by weight) are added to the suspension, and the reaction mixture is stirred at 80° C. for 24 h. After cooling, the precipitated solid is filtered off with suction and washed once with 20 ml of glacial acetic acid and three times with 20 ml of methanol each time. The solid is suspended in 300 ml of dichloromethane, 100 ml of saturated ammonium chloride solution and then 50 ml of ammonia solution are added, the mixture is stirred until the solid has dissolved, the organic phase is separated off and washed with saturated sodium chloride solution, and the organic phase is dried over magnesium sulfate and then evaporated in vacuo. The residue is recrystallised twice from ethyl acetate. Yield: 10.9 g (32 mmol), 64%, 99.0% pure according to $^1$H-NMR.

D): Cu Complex 9

1.3 g (10 mmol) of diisopropylethylamine are added to a mixture of 3.4 g (10 mmol) of bis(6-methylpyridin-2-yl)-(2-pyridin-2-yl-3H-imidazol-4-yl)methane and 1.0 g (10 mmol) of copper(I) chloride in 50 ml of THF, and the mixture is stirred at 40° C. for 24 h. The reaction mixture is evaporated to a volume of 5 ml in vacuo, and the precipitated solid is filtered off with suction, washed three times with 10 ml of methanol each time and dried in vacuo. After recrystallisation twice from DMF/EtOH, the product is sublimed in a high vacuum (p=1×10$^{-6}$ mbar, T=320° C.). Yield: 2.1 g (5.2 mmol), 52%, 99.8% pure according to HPLC.

Example 10

Cu Complex 10

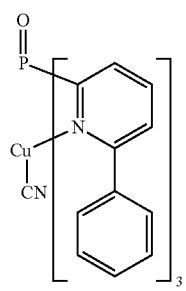

A): Tris(6-phenylpyridin-2-yl)phosphine oxide

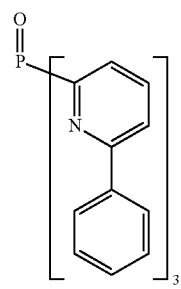

809 mg (4 mmol) of tris-tert-butylphosphine and then 674 mg (3 mmol) of palladium(II) acetate are added to a mixture of 51.8 g (100 mmol) of tris-(6-bromopyridin-2-yl)phosphine oxide [197776-47-9], 61.0 g (500 mmol) of phenylboronic acid and 58.1 g (1 mol) of potassium fluoride (anhydrous) in 1000 ml of THF, and the mixture is subsequently stirred under reflux for 5 h. After cooling, 300 ml of water are added to the reaction mixture, the aqueous phase is separated off, and the organic phase is filtered through Celite and evaporated to dryness. The solid obtained in this way is recrystallised from chloroform (50 ml) with addition of ethanol (250 ml). Yield: 38.4 g (75 mmol), 75%, 99.0% pure according to $^1$H-NMR.

B): Cu Complex 10

A mixture of 5.1 g (10 mmol) of tris(6-phenylpyridin-2-yl)phosphine oxide and 891 mg (10 mmol) of copper(I) cyanide in 50 ml of THF is stirred at 60° C. for 24 h. The reaction mixture is evaporated to a volume of 5 ml in vacuo, 20 ml of methanol are added, and the precipitated solid is filtered off with suction, washed three times with 10 ml of methanol each time and dried in vacuo. Yield: 3.7 g (6.2 mmol), 62%, 99.0% pure according to $^1$H-NMR.

Example 11

Cu Complex 11

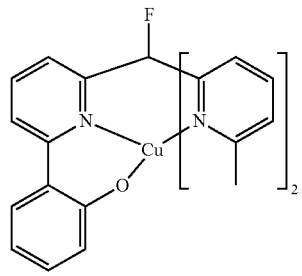

A): 2-[6-(Fluorobis(6-methylpyridin-2-yl)methyl)pyridin-2-yl]phenol

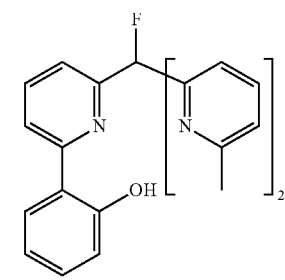

A mixture of 37.2 g (100 mmol) of (6-bromopyridin-2-yl)bis(6-methylpyridin-2-yl)fluoromethane, 16.5 g (120 mmol) of 2-hydroxyphenylboronic acid [89466-08-0], 17.4 g (300 mmol) of potassium fluoride (anhydrous), 263 mg (1.3 mmol) of tri-tert-butylphosphine and 225 mg (1 mmol) of palladium(II) acetate in 500 ml of THF is heated under reflux for 5 h. After cooling, the salts are filtered off and rinsed twice with 100 ml of THF each time, the THF is removed in vacuo, the oily residue is taken up in 500 ml of dichloromethane, and the organic phase is washed three times with 200 ml of water each time and dried over magnesium sulfate. After the magnesium sulfate has been filtered off via a Celite bed, the organic phase is evaporated to dryness, and the residue is recrystallised from ethyl acetate/heptane. Yield: 27.4 g (71 mmol), 71%, 99.0% pure according to $^1$H-NMR.

B): Cu Complex 11

1.3 g (10 mmol) of diisopropylethylamine are added to a mixture of 3.9 g (10 mmol) of 2-[6-(fluorobis(6-methylpyridin-2-yl)methyl)pyridin-2-yl]phenol and 1.0 g (10 mmol) of copper(I) chloride in 50 ml of THF, and the mixture is stirred at 40° C. for 24 h. The reaction mixture is evaporated to a volume of 5 ml in vacuo, 30 ml of methanol are added, and the precipitated solid is filtered off with suction, washed three times with 10 ml of methanol each time and dried in vacuo. After recrystallisation twice from DMF/EtOH, the product is sublimed in a high vacuum (p=1×10$^{-6}$ mbar, T=340° C.). Yield: 1.4 g (3.1 mmol), 31%, 99.5% pure according to NMR.

Example 12

Cu Complex 12

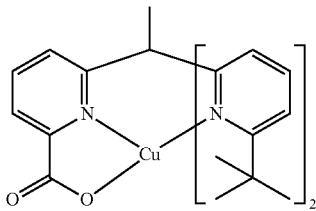

A): Bis(6-tert-butylpyridin-2-yl)methanone

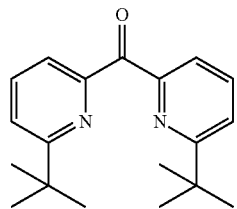 [SMILES: CC(C)(C)c1cccc(C(=O)c2cccc(C(C)(C)C)n2)n1]

80 ml (200 mmol) of n-butyllithium (2.5 N) are added dropwise to a suspension, cooled to −78° C., of 45.0 g (210 mmol) of 2-bromo-6-tert-butylpyridine [195044-14-5] in 500 ml of diethyl ether, and the mixture is stirred at −78° C. until a yellow solution forms. The yellow solution is stirred at −78° C. for a further 30 min., 9.2 ml (100 mmol) of N,N-dimethylcarbamoyl chloride [79-44-7] are then added, and the mixture is again stirred at −78° C. for a further 30 min. After warming to 0° C., a mixture of 100 ml of water and 2 ml of glacial acetic acid is added dropwise, the mixture is stirred for a further 30 min., and the precipitated solid is then filtered off with suction, washed once with 25 ml of diethyl ether and once with 25 ml of ethanol and dried in vacuo. Yield: 19.9 g (67 mmol), 67%, 97% pure according to $^1$H-NMR.

B): (6-Bromopyridin-2-yl)bis(6-tert-butylpyridin-2-yl)methanol

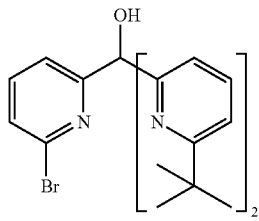

40.0 ml (100 mmol) of n-butyllithium (2.5 N) are added dropwise to a suspension, cooled to −78° C., of 26.1 g (110 mmol) of 2,6-dibromopyridine in 200 ml of diethyl ether, and the mixture is stirred at −78° C. until a yellow solution forms. This solution is diluted dropwise with 200 ml of diethyl ether, and a solution of 29.6 g (100 mmol) of bis(6-tert-butylpyridin-2-yl)methanone in 150 ml of THF is then added in one portion with vigorous stirring. After warming to 0° C., a mixture of 50 ml of water and 6 ml of glacial acetic acid is added dropwise, the mixture is stirred for a further 30 min., and the precipitated solid is then filtered off with suction, washed once with 25 ml of diethyl ether and once with 25 ml of ethanol and dried in vacuo. Yield: 23.2 g (51 mmol), 51%, 98% pure according to $^1$H-NMR.

C): (6-Carboxypyridin-2-yl)bis(6-tert-butylpyridin-2-yl)methanol

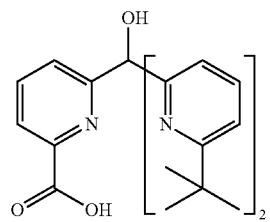

40.0 ml (100 mmol) of n-butyllithium (2.5 N) are added dropwise to a suspension, cooled to −78° C., of 22.7 g (50 mmol) of (6-bromopyridin-2-yl)bis(6-tert-butylpyridin-2-yl)methanol in 500 ml of THF. After the mixture has been stirred for a further 45 min., a vigorous stream of carbon dioxide is passed in for 30 min., the reaction mixture is then allowed to warm to room temperature and is evaporated to dryness in vacuo, the residue is taken up in 500 ml of ethyl acetate, 200 ml of water and 6 ml of acetic acid are added, and the organic phase is separated off, washed twice with 200 ml of water each time and once with 200 ml of saturated sodium chloride solution and then dried over magnesium sulfate. After removal of the solvent, the residue is recrystallised from methanol. Yield: 13.8 g (33 mmol), 66%, 95% pure according to $^1$H-NMR.

D): (6-Carboxypyridin-2-yl)bis(6-tert-butylpyridin-2-yl)methane

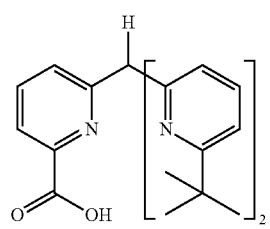

21.0 g (50 mmol) of (6-carboxypyridin-2-yl)bis(6-tert-butylpyridin-2-yl)methanol are suspended in 300 ml of glacial acetic acid. 20 ml of aqueous hypophosphorous acid (50% by weight) and 40 ml of aqueous hydroiodic acid (57% by weight) are added to the suspension, and the reaction mixture is stirred at 80° C. for 24 h. After cooling, the precipitated solid is filtered off with suction, washed once with 20 ml of glacial acetic acid and three times with 20 ml of methanol each time. The solid is suspended in 300 ml of dichloromethane, 100 ml of saturated ammonium chloride solution and then 3 ml of ammonia solution are added, the mixture is stirred until the solid has dissolved, the organic phase is separated off and washed with saturated sodium chloride solution, and the organic phase is dried over magnesium sulfate and then evaporated in vacuo. The residue is recrystallised twice from methanol. Yield: 16.6 g (41 mmol), 41%, 98.0% pure according to ¹H-NMR.

E): 1-(6-Carboxypyridin-2-yl)bis-1,1-(6-tert-butylpyridin-2-yl)ethane

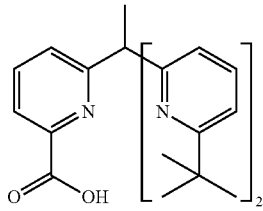

40.0 ml (100 mmol) of n-butyllithium (2.5 N) are added dropwise to a suspension, cooled to −78° C., of 20.2 g (50 mmol) of (6-carboxypyridin-2-yl)bis(6-tert-butylpyridin-2-yl)methane in 300 ml of THF. After the mixture has been stirred for a further 45 min., 3.7 ml (60 mmol) of methyl iodide are added, and the mixture is stirred at −78° C. for a further 30 min. After slow warming to room temperature, the solvent is removed in vacuo, the residue is taken up in 300 ml of ethyl acetate, 200 ml of saturated ammonium chloride solution are added, and the organic phase is separated off, washed twice with 100 ml of water each time and once with 100 ml of saturated sodium chloride solution and then dried over magnesium sulfate.

After removal of the solvent, the residue is recrystallised from methanol. Yield: 9.7 g (23 mmol), 46%, 98.0% pure according to ¹H-NMR.

F): Cu Complex 12

1.3 g (10 mmol) of diisopropylethylamine are added to a mixture of 4.2 g (10 mmol) of 1-(6-carboxypyridin-2-yl)bis-1,1-(6-tert-butylpyridin-2-yl)ethane and 1.0 g (10 mmol) of copper(I) chloride in 50 ml of THF, and the mixture is stirred at 60° C. for 24 h. The reaction mixture is evaporated to a volume of 5 ml in vacuo, 30 ml of methanol are added, and the precipitated solid is filtered off with suction, washed three times with 10 ml of methanol each time and dried in vacuo. After recrystallisation twice from THF/MeOH, the product is sublimed in a high vacuum (p=1×10⁻⁶ mbar, T=340° C.). Yield: 1.4 g (2.9 mmol), 29%, 99.8% pure according to HPLC.

Example 13

Cu Complex 13

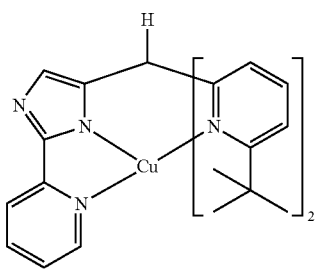

A): Bis(6-tert-butylpyridin-2-yl)-(1-methoxymethyl-2-pyridin-2-yl-3H-imidazol-4-yl)methanol

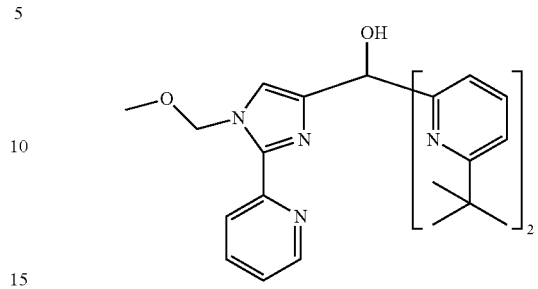

40 ml (100 mmol) of n-butyllithium (2.5 M in hexane) are added dropwise to a solution, cooled to −78° C., of 18.9 g (100 mmol) of 2-(1-methoxymethyl-1H-imidazol-2-yl)pyridine in 500 ml of THF, and the mixture is stirred for a further 30 min. A solution of 29.6 g (100 mmol) of bis(6-tert-butyl-2-pyridinyl)methanone in 150 ml of THF is subsequently added in one portion, and the reaction mixture is allowed to warm to room temperature. After addition of 100 ml of saturated ammonium chloride solution, the mixture is stirred for a further 15 min., and the organic phase is separated off, dried over potassium carbonate and then evaporated to dryness in vacuo. Yield: 32.5 g (67 mmol), 67%, 97.0% pure according to ¹H-NMR.

B): Bis(6-tert-butylpyridin-2-yl)-(2-pyridin-2-yl-3H-imidazol-4-yl)methane

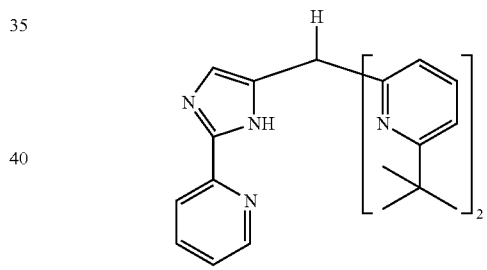

24.3 g (50 mmol) of bis(6-tert-butylpyridin-2-yl)-(1-methoxymethyl-2-pyridin-2-yl-3H-imidazol-4-yl)methanol are suspended in 300 ml of glacial acetic acid. 20 ml of aqueous hypophosphorous acid (50% by weight) and 40 ml of aqueous hydroiodic acid (57% by weight) are added to the suspension, and the reaction mixture is stirred at 80° C. for 24 h. After cooling, the precipitated solid is filtered off with suction and washed once with 20 ml of glacial acetic acid and three times with 20 ml of methanol each time. The solid is suspended in 300 ml of dichloromethane, 100 ml of saturated ammonium chloride solution and then 50 ml of ammonia solution are added, the mixture is stirred until the solid has dissolved, the organic phase is separated off and washed with saturated sodium chloride solution, and the organic phase is dried over magnesium sulfate and then evaporated in vacuo. The residue is recrystallised twice from ethyl acetate. Yield: 18.7 g (44 mmol), 88%, 99.8% pure according to ¹H-NMR.

C): Cu Complex 13

1.3 g (10 mmol) of diisopropylethylamine are added to a mixture of 4.3 g (10 mmol) of bis(6-tert-butylpyridin-2-yl)-

(2-pyridin-2-yl-3H-imidazol-4-yl)-methane and 1.0 g (10 mmol) of copper(I) chloride in 80 ml of THF, and the mixture is stirred at 40° C. for 14 h. The reaction mixture is evaporated to a volume of 5 ml in vacuo, 30 ml of methanol are added, and the precipitated solid is filtered off with suction, washed three times with 10 ml of methanol each time and dried in vacuo. After recrystallisation twice from THF/MeOH, the product is sublimed in a high vacuum (p=1×10$^{-6}$ mbar, T=330° C.). Yield: 1.8 g (3.7 mmol), 37%, 99.8% pure according to HPLC.

Example 14

Cu Complex 14

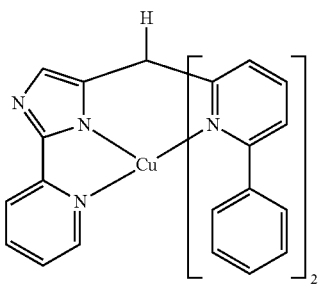

A): Bis(6-phenylpyridin-2-yl)-(1-methoxymethyl-2-pyridin-2-yl-3H-imidazol-4-yl)methanol

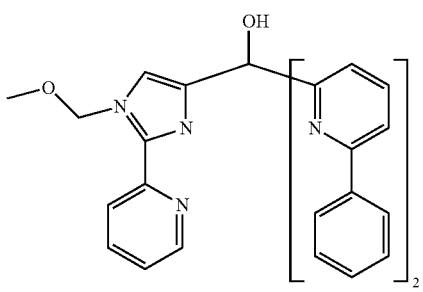

40 ml (100 mmol) of n-butyllithium (2.5 M in hexane) are added dropwise to a solution, cooled to −78° C., of 18.9 g (100 mmol) of 2-(1-methoxymethyl-1H-imidazol-2-yl)pyridine in 500 ml of THF, and the mixture is stirred for a further 30 min. A solution of 33.6 g (100 mmol) of bis(6-phenyl-2-pyridinyl)methanone [217177-35-0] in 150 ml of THF is subsequently added in one portion, and the reaction mixture is allowed to warm to room temperature. After addition of 100 ml of saturated ammonium chloride solution, the mixture is stirred for a further 15 min., and the organic phase is separated off, dried over potassium carbonate and then evaporated to dryness in vacuo. Yield: 34.2 g (65 mmol), 65%, 97.0% pure according to $^1$H-NMR.

B): Bis(6-phenylpyridin-2-yl)-(2-pyridin-2-yl-3H-imidazol-4-yl)methane

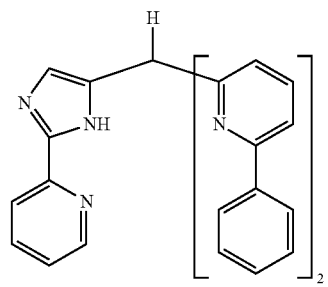

26.3 g (50 mmol) of bis(6-phenylpyridin-2-yl)-(1-methoxymethyl-2-pyridin-2-yl-3H-imidazol-4-yl)methanol are suspended in 300 ml of glacial acetic acid. 20 ml of aqueous hypophosphorous acid (50% by weight) and 40 ml of aqueous hydroiodic acid (57% by weight) are added to the suspension, and the reaction mixture is stirred at 80° C. for 24 h. After cooling, the precipitated solid is filtered off with suction and washed once with 20 ml of glacial acetic acid and three times with 20 ml of methanol each time. The solid is suspended in 300 ml of dichloromethane, 100 ml of saturated ammonium chloride solution and then 50 ml of ammonia solution are added, the mixture is stirred until the solid has dissolved, the organic phase is separated off and washed with saturated sodium chloride solution, and the organic phase is dried over magnesium sulfate and then evaporated in vacuo. The residue is recrystallised twice from ethyl acetate. Yield: 16.2 g (34 mmol), 69%, 99.0% pure according to $^1$H-NMR.

C): Cu Complex 14

1.3 g (10 mmol) of diisopropylethylamine are added to a mixture of 4.7 g (10 mmol) of bis(6-phenylpyridin-2-yl)-(2-pyridin-2-yl-3H-imidazol-4-yl)methane and 1.0 g (10 mmol) of copper(I) chloride in 100 ml of THF, and the mixture is stirred at 40° C. for 24 h. The reaction mixture is evaporated to a volume of 5 ml in vacuo, 30 ml of methanol are added, and the precipitated solid is filtered off with suction, washed three times with 10 ml of methanol each time and dried in vacuo. After recrystallisation twice from THF/MeOH, the product is sublimed in a high vacuum (p=1×10$^{-6}$ mbar, T=340° C.). Yield: 2.4 g (4.5 mmol), 45%, 99.8% pure according to HPLC.

Example 15

Cu Complex 15

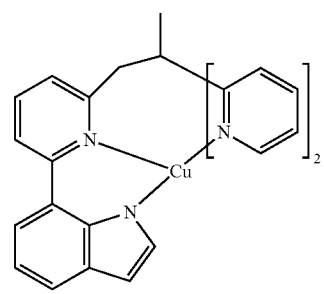

A): 2-Bromo-6-(2,2-dipyridin-2-yl)propyl)pyridine

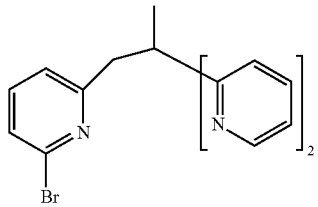

40 ml (100 mmol) of n-butyllithium (2.5 M in hexane) are added dropwise to a solution, cooled to −78° C., of 18.4 g (100 mmol) of 2,2'-ethylidenebis-pyridine [29280-41-9] in 500 ml of THF, and the mixture is stirred for a further 30 min. A solution of 20.6 g (100 mmol) of 2-bromo-6-chloromethylpyridine [727356-19-6] in 100 ml of THF is then added dropwise, and the mixture is then stirred at −78° C. for a further 15 min. After warming to room temperature, the solvent is removed in vacuo, the residue is taken up in 300 ml of dichloromethane, and the organic phase is washed twice with 100 ml of water each time and dried over magnesium sulfate. The residue is recrystallised twice from ethyl acetate/heptane. Yield: 19.5 g (55 mmol), 55%, 95.0% pure according to $^1$H-NMR.

B): 7-[6-(2,2-Dipyridin-2-yl)propyl)pyridin-2-yl]-1-H-indole

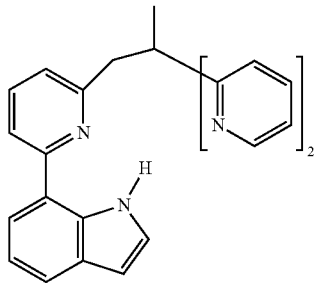

A mixture of 35.4 g (100 mmol) of 2-bromo-6-(2,2-dipyridin-2-yl)propyl)pyridine, 19.3 g (120 mmol) of indol-7-ylboronic acid [210889-31-9], 17.4 g (300 mmol) of potassium fluoride (anhydrous), 263 mg (1.3 mmol) of tritert-butylphosphine and 225 mg (1 mmol) of palladium(II) acetate in 500 ml of THF is heated under reflux for 5 h. After cooling, the salts are filtered off and washed twice with 100 ml of THF each time, the THF is removed in vacuo, the oily residue is taken up in 500 ml of dichloromethane, and the organic phase is washed three times with 200 ml of water each time and dried over magnesium sulfate. After the magnesium sulfate has been filtered off via a Celite bed, the organic phase is evaporated to dryness, and the residue is recrystallised from ethyl acetate/heptane. Yield: 29.3 g (75 mmol), 75%, 99.0% pure according to $^1$H-NMR.

C): Cu Complex 15

1.3 g (10 mmol) of diisopropylethylamine are added to a mixture of 3.9 g (10 mmol) of 7-[6-(2,2-dipyridin-2-yl)propyl)pyridin-2-yl]-1-H-indole and 1.0 g (10 mmol) of copper(I) chloride in 100 ml of THF, and the mixture is stirred at 40° C. for 24 h. The reaction mixture is evaporated to a volume of 5 ml in vacuo, 30 ml of methanol are added, and the precipitated solid is filtered off with suction, washed three times with 10 ml of methanol each time and dried in vacuo. After recrystallisation twice from THF/MeOH, the product is sublimed in a high vacuum (p=1×10$^{-6}$ mbar, T=340° C.). Yield: 1.3 g (2.9 mmol), 29%, 99.7% pure according to HPLC.

Example 16

Ag Complexes 1.3 g (10 mmol) of diisopropylethylamine are added to a mixture of 10 mmol of ligands and 2.5 g (10 mmol) of silver hexafluorophosphate in 100 ml of THF, and the mixture is stirred at 40° C. for 24 h. The reaction mixture is evaporated to a volume of 5 ml in vacuo, 30 ml of methanol are added, and the precipitated solid is filtered off with suction, washed three times with 10 ml of methanol each time and dried in vacuo. After recrystallisation twice from THF/MeOH, the product is sublimed in a high vacuum (p=1×10$^{-6}$ mbar).

| Ex. | Ligand | Complex | Yield |
|---|---|---|---|
| 17 | | | 27% |

-continued

| Ex. | Ligand | Complex | Yield |
|---|---|---|---|
| 18 | | | 23% |
| 19 | | | 24% |
| 20 | | | 31% |

Example 21

Production and Characterisation of Organic Electroluminescent Devices from the Gas Phase Electroluminescent devices according to the invention can be produced as described, for example, in WO 05/003253. The results for various OLEDs are compared here. The basic structure, the materials used, the degree of doping and their layer thicknesses are identical for better comparability.

The following device structure is used here:

| | |
|---|---|
| Hole-injection layer (HIL) | 20 nm of 2,2',7,7'-tetrakis(di-para-tolyl-amino)spiro-9,9'-bifluorene |
| Hole-transport layer (HTL1) | 5 nm of NPB (N-naphthyl-N-phenyl-4,4'-diaminobiphenyl) |
| Electron-blocking layer (EBL) | EBM1, 10 nm or EBM2, 10 nm |
| Emission layer (EML) | matrix M1, M2, M3 or M4 or combinations thereof, 40 nm; emitter: 10% by vol. doping; compounds, see Table 1. |
| Electron conductor (ETL) | 20 nm of BAlq |
| Cathode | 1 nm of LiF, 100 nm of Al on top. |

The structures of EBM, M and TEB are depicted below for clarity.

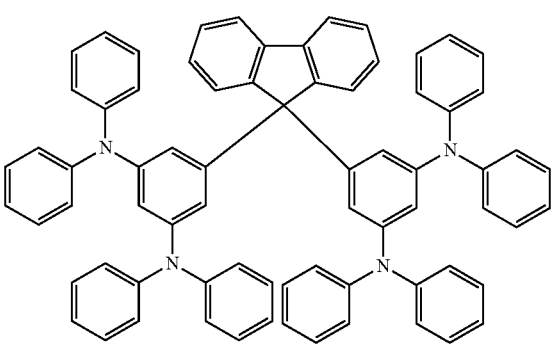

EBM1

WO 09/124627

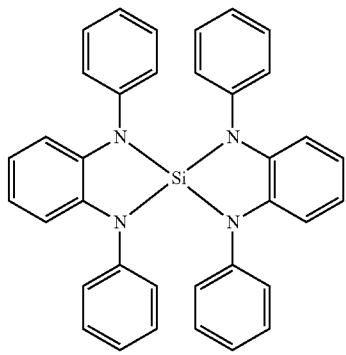

WO 10/054729

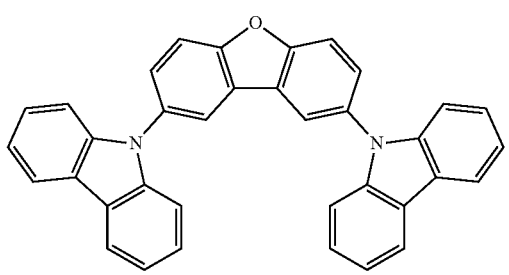

CAS [913737-84-5]

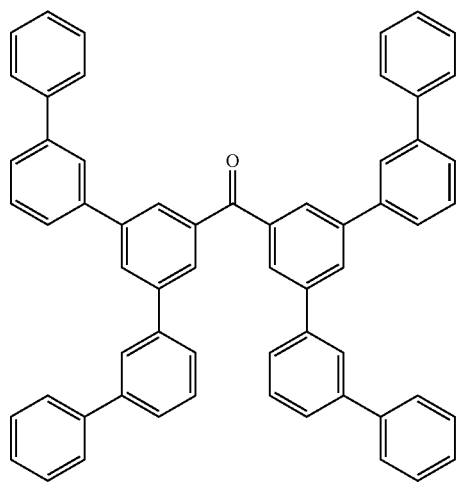

WO 10/006680

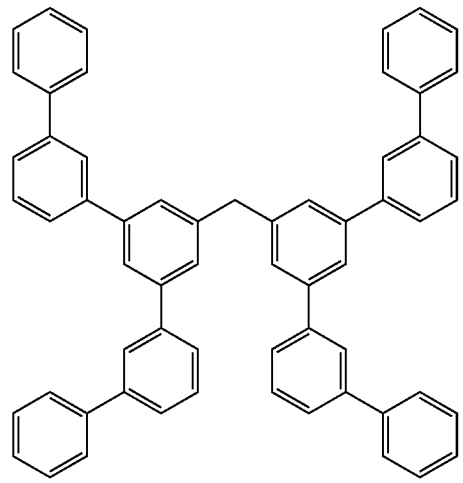

WO 10/006680

These as yet unoptimised OLEDs are characterised by standard methods; for this purpose, the electroluminescence spectra, the external quantum efficiency (measured in %) as a function of the luminance, calculated from current/voltage/luminance characteristic lines (IUL characteristic lines), are determined.

TABLE 1

Device results

| Ex. | EBL | Matrix Emitter | EQE at 100 cd/m² [%] | Voltage at 100 cd/m² [V] | CIE x/y |
|---|---|---|---|---|---|
| 22 | EBM1 | M3<br>Cu complex 7 | 7.8 | 6.3 | 0.24/0.62 |
| 23 | EBM1 | M1 (40%)<br>M3 (50%)<br>Cu complex 7 | 6.8 | 5.7 | 0.25/0.59 |
| 24 | EBM2 | M3<br>Cu complex 8 | 9.5 | 5.5 | 0.17/0.46 |
| 25 | EBM2 | M3 (50%)<br>M4 (40%)<br>Cu complex 8 | 8.9 | 5.8 | 0.19/0.48 |
| 26 | EBM2 | M3<br>Ex. 27<br>Cu complex 9 | 7.5 | 6.1 | 0.17/0.39 |
| 27 | EBM1 | M2<br>Cu complex 9 | 8.3 | 7.4 | 0.17/0.38 |
| 28 | EBM2 | M1 (20%)<br>M3 (70%)<br>Cu complex 11 | 9.4 | 6.4 | 0.25/0.55 |
| 29 | EBM2 | M1 (30%)<br>M3 (60%)<br>Cu complex 11 | 10.5 | 6.2 | 0.25/0.53 |
| 30 | EBM2 | M1 (20%)<br>M3 (70%)<br>Cu complex 12 | 6.1 | 6.5 | 0.56/0.42 |
| 31 | EBM2 | M1 (20%)<br>M3 (70%)<br>Cu complex 13 | 7.8 | 5.9 | 0.35/0.60 |
| 32 | EBM2 | M1 (20%)<br>M3 (70%)<br>Cu complex 14 | 8.0 | 6.0 | 0.37/0.60 |
| 33 | EBM1 | M1 (10%)<br>M3 (80%)<br>Cu complex 15 | 6.5 | 6.8 | 0.67/0.31 |
| 34 | EBM2 | M1 (20%)<br>M3 (70%)<br>Ag complex 18 | 4.2 | 6.0 | 0.30/0.59 |

TABLE 1-continued

Device results

| Ex. | EBL | Matrix Emitter | EQE at 100 cd/m² [%] | Voltage at 100 cd/m² [V] | CIE x/y |
|---|---|---|---|---|---|
| 35 | EBM2 | M1 (20%) M3 (70%) Ag complex 19 | 5.0 | 5.7 | 0.32/0.61 |

Example 36

Production and Characterisation of Organic Electroluminescent Devices from Solution LEDs are produced by the general process outlined below. This must of course be adapted in individual cases to the particular circumstances (for example layer-thickness variation in order to achieve optimum efficiency or colour).
General Process for the Product Ion of OLEDs:

The production of components of this type is based on the production of polymeric light-emitting diodes (OLEDs), which has already been described many times in the literature (for example in WO 04/037887 A2). In the present case, the compounds according to the invention are dissolved in toluene, chlorobenzene or DMF together with the matrix materials or matrix-material combinations mentioned. The typical solids content of such solutions is between 10 and 25 g/l if, as here, the typical layer thickness of 80 nm for a device is to be achieved by means of spin coating.

OLEDs having the following structure are produced analogously to the general process indicated above:

| PEDOT | 20 nm (applied by spin-coating from water; PEDOT purchased from BAYER AG; poly[3,4-ethylenedioxy-2,5-thiophene] |
|---|---|
| Matrix + emitter | 80 nm, 10% by weight emitter concentration (applied by spin-coating from toluene, chlorobenzene or DMF) |
| Ba/Ag | 10 nm of Ba/150 nm of Ag as cathode. |

Structured ITO substrates and the material for the so-called buffer layer (PEDOT, actually PEDOT:PSS) are commercially available (ITO from Technoprint and others, PEDOT:PSS as Clevios Baytron P aqueous dispersion from H.C. Starck). The emission layer is applied by spin-coating in an inert-gas atmosphere, in the present case argon, and dried by heating at 120° C. for 10 min. Finally, a cathode comprising barium and aluminium is applied by vacuum vapour deposition. The solution-processed devices are characterised by standard methods; the OLED examples mentioned have not yet been optimised. Table 2 shows the efficiency and voltage at 100 cd/m² and the colour.

TABLE 2

Device results

| Ex. | Matrix Emitter | EQE at 100 cd/m² [%] | Voltage at 100 cd/m² [V] | CIE x/y |
|---|---|---|---|---|
| 37 | M1 (30%) M4 (60%) Cu complex 1 | 2.1 | 8.9 | 0.35/0.61 |
| 38 | M3 (45%) M4 (45%) Cu complex 6 | 3.4 | 6.2 | 0.17/0.55 |

TABLE 2-continued

Device results

| Ex. | Matrix Emitter | EQE at 100 cd/m² [%] | Voltage at 100 cd/m² [V] | CIE x/y |
|---|---|---|---|---|
| 39 | M1 (30%) M4 (60%) Cu complex 10 | 4.9 | 7.7 | 0.30/0.42 |
| 40 | M1 (30%) M4 (60%) Cu complex 17 | 3.0 | 6.9 | 0.51/0.40 |
| 41 | M1 (30%) M4 (60%) Cu complex 20 | 4.1 | 6.8 | 0.65/0.30 |

The invention claimed is:

1. An electronic device comprising an anode, a cathode and at least one compound of the formula (1)

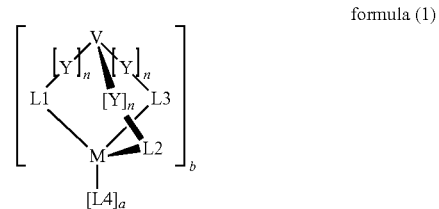

formula (1)

containing a metal M coordinated to a ligand L of the formula (2)

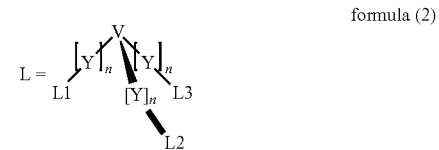

formula (2)

where the following applies to the symbols and indices used:

M is selected from Cu(I), Ag(I), Au(I), Ni(0), or Pd(0);
a is 0 and V is N or P, and V is coordinated to M through an electron lone pair, or
a is 1 and V is not coordinated to M, and is selected from B, BR⁻, CR, CO⁻, SiR, NR⁺, or P(=O); or V is a cyclic group of one of the formulae (31) to (34)

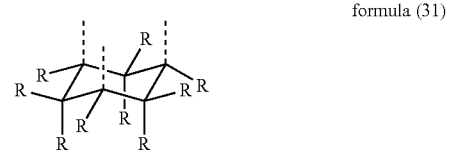

formula (31)

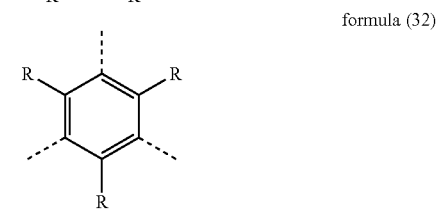

formula (32)

-continued
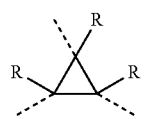
formula (33)
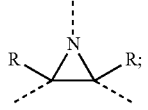
formula (34)
Y is, identically or differently on each occurrence, a divalent group selected from $CR_2$, BR, $SiR_2$, NR, PR, P(=O)R, O or S;
b is 1;
L1 is selected from the groups of the formulae (3) to (30):
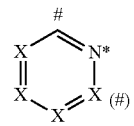
formula (3)
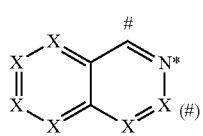
formual (4)
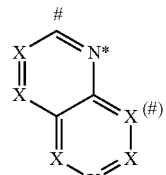
formula (5)
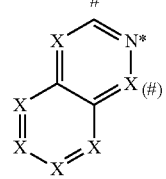
formula (6)
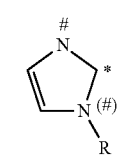
formula (7)
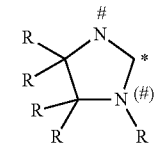
formula (8)
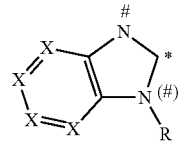
formula (9)
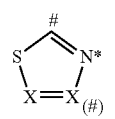
formula (10)
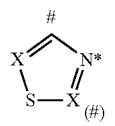
formula (11)
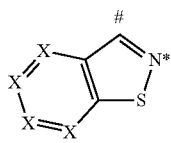
formula (12)
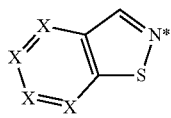
formula (13)
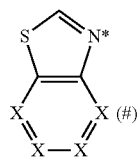
formula (14)
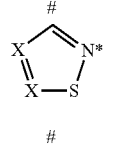
formula (15)
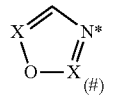
formula (16)
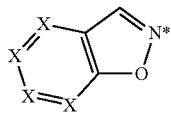
formula (17)
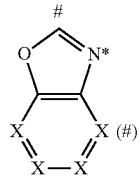
formula (18)
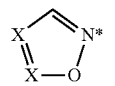
formula (19)
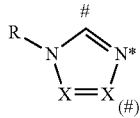
formula (20)

-continued formula (21)

formula (22)

formula (23)

formula (24)

formula (25)

formula (26)

formula (27)

formula (28)

formula (29)

formula (30)

X is on each occurrence, identically or differently, CR or N;
D is on each occurrence, identically or differently, O$^-$, S$^-$, NR$^-$, PR$^-$, NR$_2$, PR$_2$, COO$^-$, SO$_3^-$, —C(=O)R, —CR (=NR) or —N(=CR$_2$);
and the groups are coordinated to the metal M via the position denoted by *; the position denoted by # indicates the position at which the part-ligand is bonded to Y or to V, and the position denoted by (#) indicates the position at which the part-ligand is optionally bonded to Y or to L4, and if a further bond of this type to Y or to L4 is present, the corresponding symbol X(#) is C, and there is no group R bonded to the symbol N(#) in the formulae (7), (8), (9), (21) and (23);

L2 and L3 are selected, identically or differently on each occurrence, from the group consisting of —NR$_2$, —NR$^-$, —N=C(R$^1$)$_2$, —PR$_2$, —PR(OR), P(OR)$_2$, —S$^-$, —SR and L1;

L4 is a carbon monoxide, nitrogen monoxide, alkyl cyanide, aryl cyanide, alkyl isocyanide, aryl isocyanide, amine, halophosphine, trialkylphosphine, triarylphosphine, alkylarylphosphine, phosphite, arsine, stibene, neutral or anionic nitrogen-containing heterocycles, carbene, hydride, deuteride, F$^-$, Cl$^-$, Br$^-$, alkylacetylide, arylacetylide, cyanide, cyanate, isocyanate, thiocyanate, isothiocyanate, aliphatic or aromatic alcoholate, aliphatic or aromatic thioalcoholates, amide, carboxylate, or formula (56)

wherein, in formula (56), X and D are as defined for formulae (3) to (30), * indicates the position of the coordination to M, and the position denoted by (#) indicates the position at which L4 is optionally bonded, optionally via —(Y)$_n$—, one of the part-ligands L1, L2 and L3 and if L4 is bonded to the part-ligand L1, L2 or L3 directly or through Y$_n$, the corresponding symbol X(#) is C;

n is on each occurrence, identically or differently, 0, 1 or 2;
R is on each occurrence, identically or differently, H, D, F, Cl, Br, I, N(R$^1$)$_2$, CN, NO$_2$, OH, Si(R$^1$)$_3$, B(OR$^1$)$_2$, C(=O)R$^1$, P(=O)(R$^1$)$_2$, S(=O)R$^1$, S(=O)$_2$R$^1$, OSO$_2$R$^1$, a straight-chain alkyl, alkoxy or thioalkoxy group having 1 to 40 C atoms or a branched or cyclic alkyl, alkoxy or thioalkoxy group having 3 to 40 C atoms or an alkenyl or alkynyl group having 2 to 40 C atoms, each of which is optionally substituted by one or more radicals R$^1$, where one or more non-adjacent CH$_2$ groups is optionally replaced by R$^1$C=CR$^1$, C=C, Si(R$^1$)$_2$, Ge(R$^1$)$_2$, Sn(R$^1$)$_2$, C=O, C=S, C=Se, C=NR$^1$, P(=O)(R$^1$), SO, SO$_2$, NR$^1$, O, S or CONR$^1$ and where one or more H atoms is optionally replaced by F, Cl, Br, I, CN or NO$_2$, or an aromatic or heteroaromatic ring system having 5 to 60 aromatic ring atoms, which may in each case be substituted by one or more radicals R$^1$, or an aryloxy, heteroaryloxy, aralkyl or heteroarylalkyl group having 5 to 60 aromatic ring atoms, which may be substituted by one or more radicals R$^1$, or a diarylamino group, diheteroarylamino group or arylheteroarylamino group having 10 to 40 aromatic ring atoms, which is optionally substituted by one or more radicals R$^1$;

two or more substituents R here may also form a mono- or polycyclic, aliphatic, aromatic, heteroaromatic and/or benzo-fused ring system with one another;

$R^1$ is on each occurrence, identically or differently, H, D, F, Cl, Br, I, $N(R^2)_2$, CN, $NO_2$, OH, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms or an alkenyl or alkynyl group having 2 to 40 C atoms, each of which may be substituted by one or more radicals $R^2$, where one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or an aromatic or heteroaromatic ring system having 5 to 60 aromatic ring atoms, which may in each case be substituted by one or more radicals $R^2$, or an aryloxy, heteroaryloxy, aralkyl or heteroarylalkyl group having 5 to 60 aromatic ring atoms, which is optionally substituted by one or more radicals $R^2$, or a diarylamino group, diheteroarylamino group or arylheteroarylamino group having 10 to 40 aromatic ring atoms, which is optionally substituted by one or more radicals $R^2$; two or more substituents $R^1$ here may also form a mono- or polycyclic, aliphatic, aromatic, heteroaromatic and/or benzo-fused ring system with one another;

$R^2$ is on each occurrence, identically or differently, H, D, F, or an aliphatic, aromatic or heteroaromatic radical having 1 to 20 C atoms, in which, in addition, one or more H atoms is optionally replaced by F; two or more substituents $R^2$ here may also form a mono- or polycyclic, aliphatic, aromatic, heteroaromatic and/or benzo-fused ring system with one another.

2. The electronic device according to claim 1, wherein the device is an organic electroluminescent device, organic integrated circuit (O-IC), organic field-effect transistor (O-FET), organic thin-film transistor (O-TFT), organic light-emitting transistor (O-LET), organic solar cell (O-SC), organic optical detector, organic photoreceptor, organic field-quench device (O-FQD), light-emitting electrochemical cell (LEC) or organic laser diode (O-laser).

3. The electronic device according to claim 1, wherein the device is an organic light-emitting diode.

4. The electronic device according to claim 1, wherein the device is an organic electroluminescent device and the compound of the formula (1) is employed as emitting compound in an emitting layer.

5. The electronic device according to claim 4, wherein the compound of the formula (1) is employed in combination with one or more matrix materials which are selected from the group consisting of ketone, phosphine oxide, sulfoxide, sulfone, triarylamine, carbazole derivative, indolocarbazole derivative, indenocarbazole derivative, azacarbazole, bipolar matrix material, silane, azaborole, boronic ester, triazine derivative, zinc complex, diaza- or tetraazasilole derivative and diazaphosphole derivative.

6. The electronic device according to claim 1, wherein the compound of the formula (1) is used as matrix material for an emitting compound in an emitting layer and/or as hole-blocking material in a hole-blocking layer and/or as electron-transport material in an electron-transport layer and/or as hole-transport material in a hole-transport- or -injection layer and/or as electron-blocking material is an electron-blocking layer.

7. A compound of the formula ML', containing a metal M tetra-coordinated to a ligand L', where the ligand L' conforms to one of the formulae (62) to (66) and each of the part-ligands L1, L2, L3 and L4 is coordinated to M:

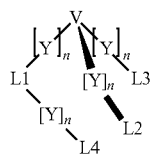

formula (62)

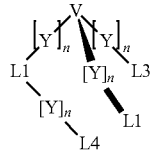

formula (63)

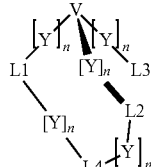

formula (64)

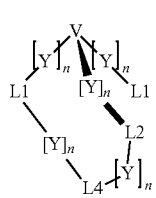

formula (65)

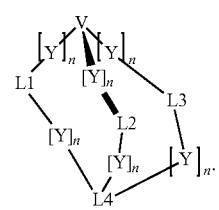

formula (66)

M is selected from Cu(I), Ag(I), Au(I), Ni(0), or Pd(0);

V is selected from B, $BR^-$, CR, $CO^-$, SiR, $NR^+$, or $P(=O)$; or V is a cyclic group of one of the formulae (31) to (34);

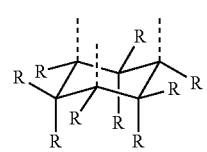

formula (31)

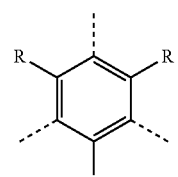

formula (32)

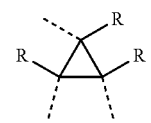

formula (33)

formula (34)
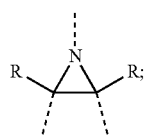
Y is, identically or differently on each occurrence, a divalent group selected from CR₂, BR, SiR₂, NR, PR, P(=O)R, O or S;
L1 is selected from the groups of the formulae (3) to (30):
formula (3)
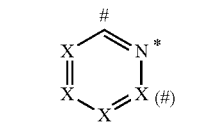
formula (4)
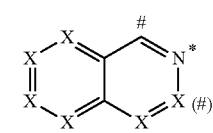
formula (5)
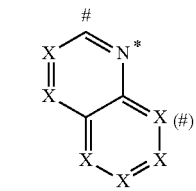
formula (6)
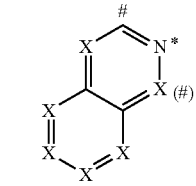
formula (7)
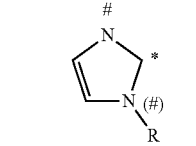
formula (8)
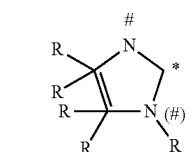
formula (9)
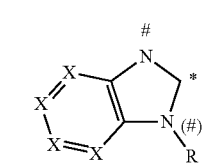
formula (10)
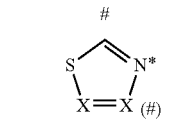
formula (11)
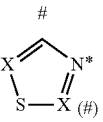
formula (12)
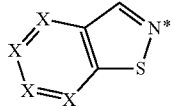
formula (13)
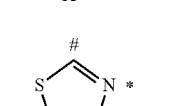
formula (14)
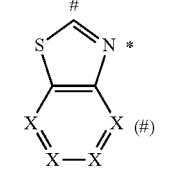
formula (15)
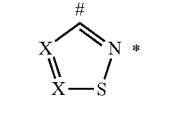
formula (16)
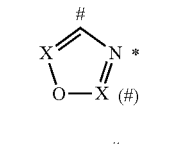
formula (17)
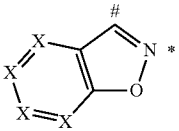
formula (18)
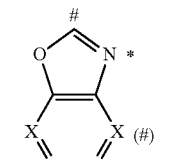
formula (19)
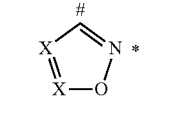
formula (20)
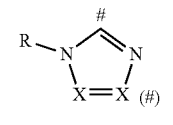
formula (21)
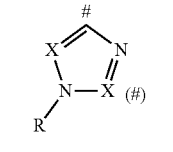
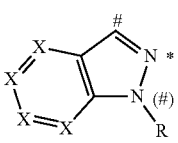

-continued

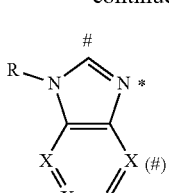
formula (22)

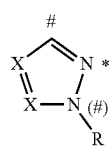
formula (23)

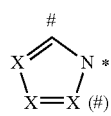
formula (24)

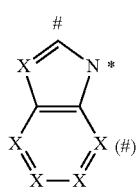
formula (25)

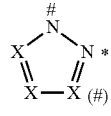
formula (26)

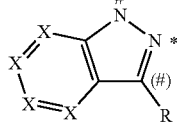
formula (27)

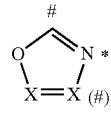
formula (28)

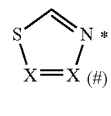
formula (29)

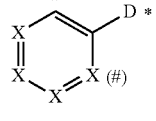
formula (30)

X is on each occurrence, identically or differently, CR or N;

D is on each occurrence, identically or differently, O⁻, S⁻, NR⁻, PR⁻, NR₂, PR₂, COO⁻, SO₃⁻, —C(=O)R, —CR(=NR) or —N(=CR₂);

and the groups are coordinated to the metal M via the position denoted by *; the position denoted by # indicates the position at which the part-ligand is bonded to Y or to V, and the position denoted by (#) indicates the position at which the part-ligand is optionally bonded to Y or to L4, and if a further bond of this type to Y or to L4 is present, the corresponding symbol X(#) is C, and there is no group R bonded to the symbol N(#) in the formulae (7), (8), (9), (21) and (23);

L2 and L3 are selected, identically or differently on each occurrence, from the group consisting of —NR₂, —NR⁻, —N=C(R¹)₂, —PR₂, —PR(OR), P(OR)₂, —S⁻, —SR and L1;

L4 is a carbon monoxide, nitrogen monoxide, alkyl cyanide, aryl cyanide, alkyl isocyanide, aryl isocyanide, amine, halophosphine, trialkylphosphine, triarylphosphine, alkylarylphosphine, phosphite, arsine, stibene, neutral or anionic nitrogen-containing heterocycles, carbene, hydride, deuteride, F⁻, Cl⁻, Br⁻, I⁻, alkylacetylide, arylacetylide, cyanide, cyanate, isocyanate, thiocyanate, isothiocyanate, aliphatic or aromatic alcoholate, aliphatic or aromatic thioalcoholates, amide, carboxylate, or

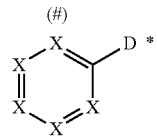
formula (56)

wherein, in formula (56), X and D are as defined for formulae (3) to (30), * indicates the position of the coordination to M, and the position denoted by (#) indicates the position at which L4 is optionally bonded, optionally via —(Y)ₙ—, one of the part-ligands L1, L2 and L3 and if L4 is bonded to the part-ligand L1, L2 or L3 directly or through Yₙ, the corresponding symbol X(#) is C;

n is on each occurrence, identically or differently, 0, 1 or 2;

R is on each occurrence, identically or differently, H, D, F, Cl, Br, I, N(R¹)₂, CN, NO₂, OH, Si(R¹)₃, B(OR¹)₂, C(=O)R¹, P(=O)(R¹)₂, S(=O)R¹, S(=O)₂R¹, OSO₂R¹, a straight-chain alkyl, alkoxy or thioalkoxy group having 1 to 40 C atoms or a branched or cyclic alkyl, alkoxy or thioalkoxy group having 3 to 40 C atoms or an alkenyl or alkynyl group having 2 to 40 C atoms, each of which is optionally substituted by one or more radicals R¹, wherein one or more non-adjacent CH₂ groups is optionally replaced by R¹C=CR¹, C≡C, Si(R¹)₂, Ge(R¹)₂, Sn(R¹)₂, C=O, C=S, C=Se, C=NR¹, P(=O)(R¹), SO, SO₂, NR¹, O, S or CONR¹ and where one or more H atoms is optionally replaced by F, Cl, Br, I, CN or NO₂, or an aromatic or heteroaromatic ring system having 5 to 60 aromatic ring atoms, which may in each case be substituted by one or more radicals R¹, or an aryloxy, heteroaryloxy, aralkyl or heteroarylalkyl group having 5 to 60 aromatic ring atoms, which may be substituted by one or more radicals R¹, or a diarylamino group, diheteroarylamino group or arylheteroarylamino group having 10 to 40 aromatic ring atoms, which is optionally substituted by one or more radicals R¹; two or more substituents R here may also form a mono- or polycyclic, aliphatic, aromatic, heteroaromatic and/or benzo-fused ring system with one another;

R¹ is on each occurrence, identically or differently, H, D, F, Cl, Br, I, N(R²)₂, CN, NO₂, OH, Si(R²)₃, B(OR²)₂, C(=O)R², P(=O)(R²)₂, S(=O)R², S(=O)₂R², OSO$_2$R$^2$, a straight-chain alkyl, alkoxy or thioalkoxy group having 1 to 40 C atoms or a branched or cyclic alkyl, alkoxy or thioalkoxy group having 3 to 40 C atoms or an alkenyl or alkynyl group having 2 to 40 C atoms, each of which may be substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 60 aromatic ring atoms, which may in each case be substituted by one or more radicals R$^2$, or an aryloxy, heteroaryloxy, aralkyl or heteroarylalkyl group having 5 to 60 aromatic ring atoms, which is optionally substituted by one or more radicals R$^2$, or a diarylamino group, diheteroarylamino group or arylheteroarylamino group having 10 to 40 aromatic ring atoms, which is optionally substituted by one or more radicals R$^2$; two or more substituents R$^1$ here may also form a mono- or polycyclic, aliphatic, aromatic, heteroaromatic and/or benzo-fused ring system with one another;

R$^2$ is on each occurrence, identically or differently, H, D, F, or an aliphatic, aromatic or heteroaromatic radical having 1 to 20 C atoms, in which, in addition, one or more H atoms is optionally replaced by F; two or more substituents R$^2$ here may also form a mono- or polycyclic, aliphatic, aromatic, heteroaromatic and/or benzo-fused ring system with one another.

8. A process for the preparation of the compound according to claim 7, which comprises reacting the corresponding free ligands with metal salts or metal complexes of the corresponding metal M.

9. The electronic device according to claim 1, wherein the neutral or anionic nitrogen-containing heterocycles are selected from formulae (35)-(37), (41)-(55) and (57)-(61), or the carbene is selected from formulae (38)-(40),

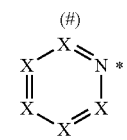

formula (35)

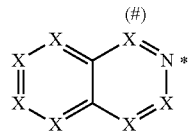

formula (36)

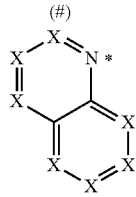

formula (37)

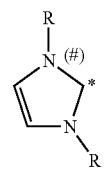

formula (38)

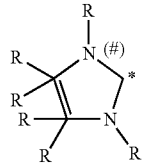

formula (39)

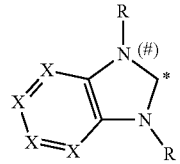

formula (40)

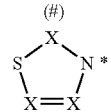

formula (41)

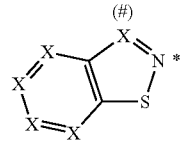

formula (42)

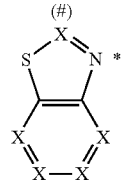

formula (43)

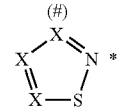

formula (44)

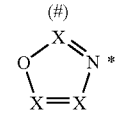

formula (45)

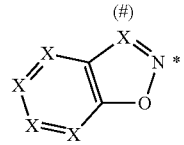

formula (46)

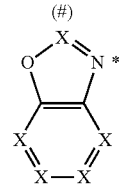

formula (47)

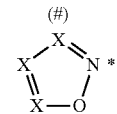

formula (48)

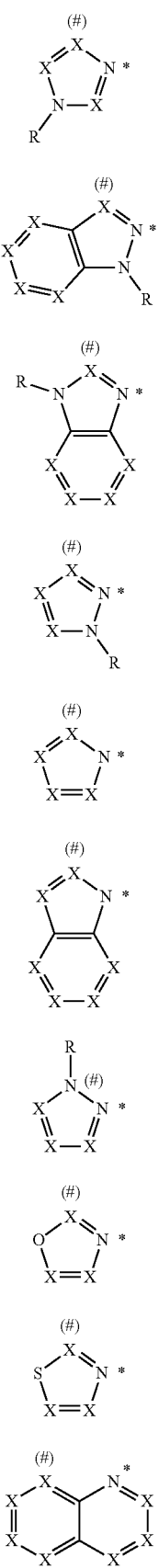

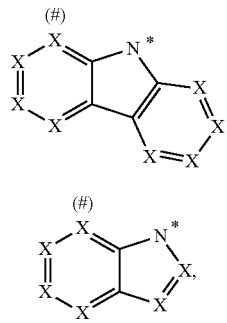

\* indicates the position of the coordination to M, and the position denoted by (#) indicates the position at which L4 is optionally bonded, optionally via —(Y)$_n$—, to one of the part-ligands L1, L2 and L3, and if L4 is bonded to the part-ligand L1, L2 or L3 directly or through Y$_n$, the corresponding symbol X(#) is C, and there is no group R bonded to the symbol N(#) in the formulae (38)-(40) and (55); and wherein X and D are as defined for formulae (3) to (30).

10. The electronic device according to claim 9, wherein the ligand L has a structure of one of the formulae (62) to (66):

11. The compound according to claim 7, wherein the neutral or anionic nitrogen-containing heterocycles are selected from formulae (35)-(37), (41)-(55) and (57)-(61), or the carbene is selected from formulae (38)-(40),
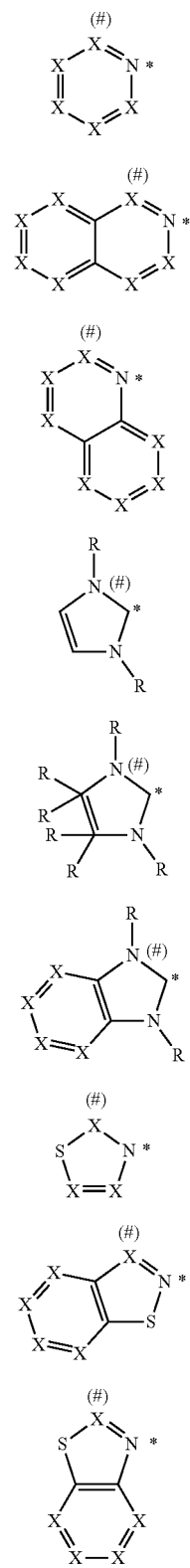
formula (35)
formula (36)
formula (37)
formula (38)
formula (39)
formula (40)
formula (41)
formula (42)
formula (43)
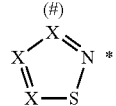
formula (44)
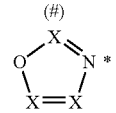
formula (45)
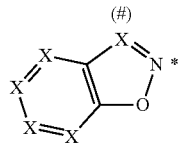
formula (46)
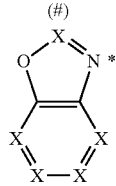
formula (47)
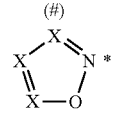
formula (48)
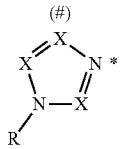
formula (49)
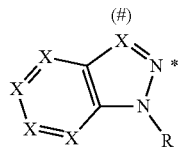
formula (50)
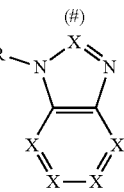
formula (51)
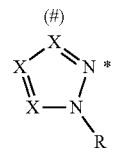
formula (52)
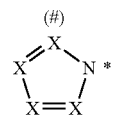
formula (53)

-continued

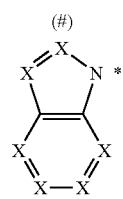

formula (54)

formula (55)

formula (57)

formula (58)

formula (59)

formula (60)

formula (61)

* indicates the position of the coordination to M, and the position denoted by (#) indicates the position at which L4 is optionally bonded, optionally via —(Y)$_n$—, to one of the part-ligands L1, L2 and L3, and if L4 is bonded to the part-ligand L1, L2 or L3 directly or through Y$_n$, the corresponding symbol X(#) is C, and there is no group R bonded to the symbol N(#) in the formulae (38)-(40) and (55); and wherein X and D are as defined for formulae (3) to (30).

12. The electronic device of claim 1, wherein the at least one compound of the formula (1) is electrically neutral when, if a is 0 the sum of charge of ligands L1, L2 and L3 compensate the charge of the metal M, or if a is 1 the sum of the charge of ligands L1, L2, L3 and L4 compensate for the charge of the metal M.

13. The compound of claim 7, wherein the at least one compound of the formula ML' is electrically neutral as the sum of charge of ligands L1, L2, L3 and L4 compensate for the charge of the metal M.

14. The electronic device of claim 12, wherein M is Cu(I) or Ag(I).

15. The compound of claim 7, wherein M is Cu(I) and the compound is selected from the group consisting of

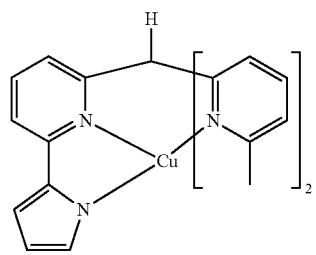

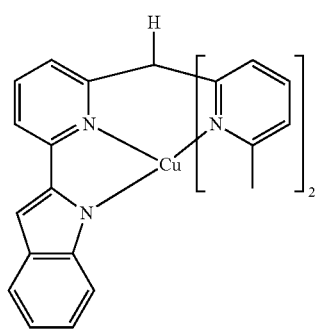

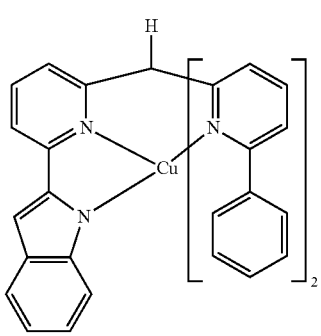

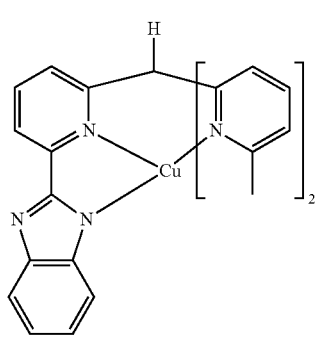

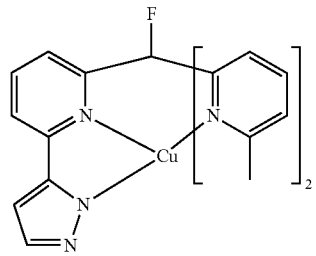

75
-continued
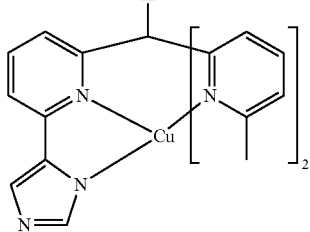
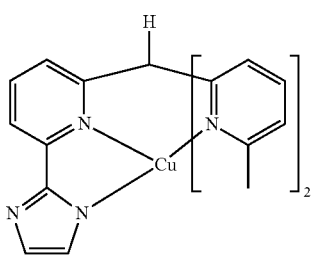
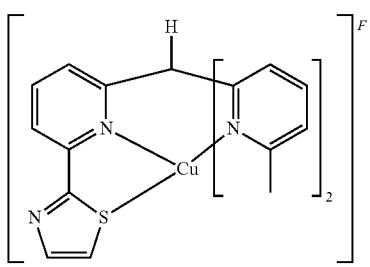
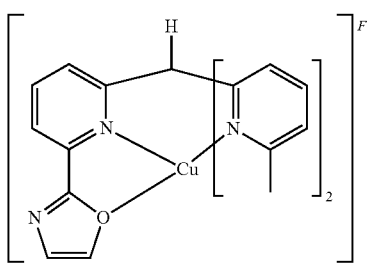
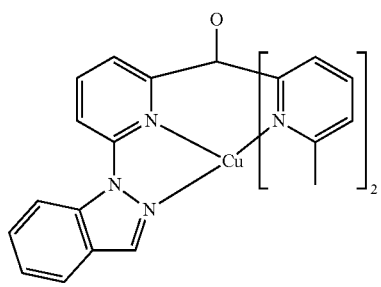
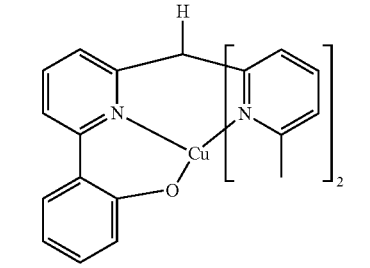
76
-continued
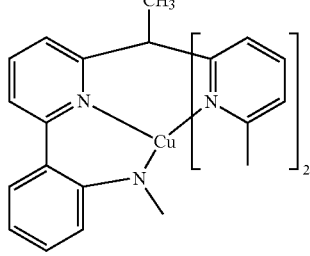
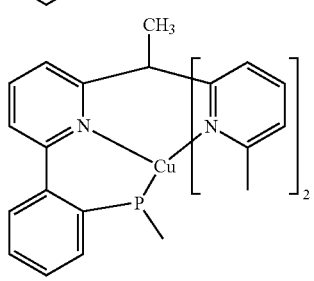
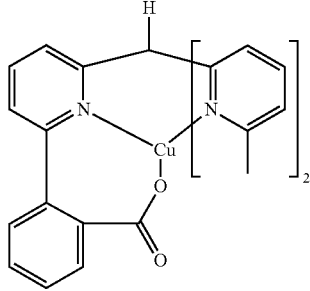
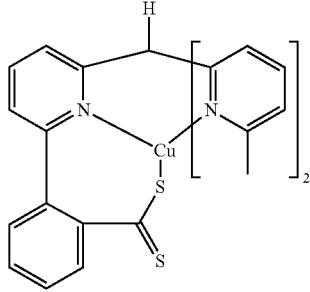
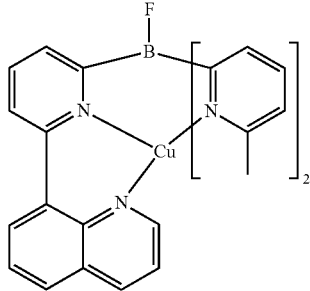
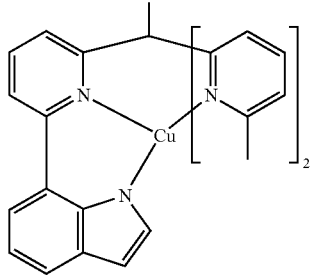

77
-continued
78
-continued
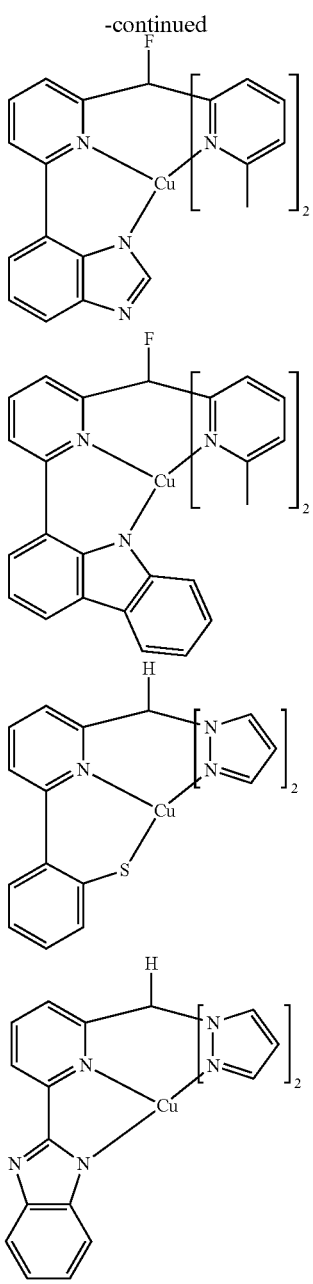
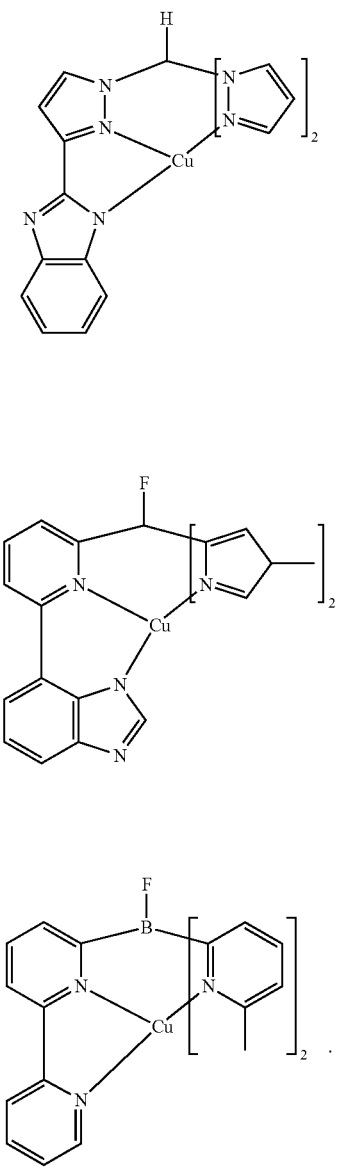
* * * * *